United States Patent
Khandelwal et al.

(10) Patent No.: US 8,472,266 B2
(45) Date of Patent: Jun. 25, 2013

(54) REDUCING NEIGHBOR READ DISTURB

(75) Inventors: Anubhav Khandelwal, Mountain View, CA (US); Jun Wan, San Jose, CA (US); Shih-Chung Lee, Yokohama (JP); Dana Lee, Saratoga, CA (US)

(73) Assignee: SanDisk Technologies Inc., Plano, TX (US)

(*) Notice: Subject to any disclaimer, the term of this patent is extended or adjusted under 35 U.S.C. 154(b) by 160 days.

(21) Appl. No.: 13/077,778

(22) Filed: Mar. 31, 2011

(65) Prior Publication Data

US 2012/0250414 A1  Oct. 4, 2012

(51) Int. Cl.
*G11C 11/34* (2006.01)

(52) U.S. Cl.
USPC .................................. 365/189.15

(58) Field of Classification Search
USPC .................................. 365/189.09
See application file for complete search history.

(56) References Cited

U.S. PATENT DOCUMENTS

| | | | |
|---|---|---|---|
| 7,170,780 B2 * | 1/2007 | Kawai ...................... 365/185.03 |
| 7,187,585 B2 | 3/2007 | Li et al. | |
| 7,436,733 B2 | 10/2008 | Mokhlesi | |
| 7,440,331 B2 | 10/2008 | Hemink | |
| 7,450,421 B2 | 11/2008 | Mokhlesi et al. | |
| 7,480,176 B2 | 1/2009 | Kamei | |
| 7,495,962 B2 | 2/2009 | Mokhlesi | |
| 7,701,784 B2 * | 4/2010 | Maejima et al. ......... 365/189.09 |
| 2006/0221683 A1 | 10/2006 | Chen et al. | |
| 2008/0158973 A1 | 7/2008 | Mui et al. | |
| 2008/0158985 A1 | 7/2008 | Mokhlesi | |
| 2009/0003080 A1 | 1/2009 | Noh | |
| 2009/0016110 A1 | 1/2009 | Choi et al. | |
| 2009/0073763 A1 | 3/2009 | Hosono | |
| 2010/0008136 A1 * | 1/2010 | Seol et al. ................... 365/185.2 |
| 2010/0067299 A1 * | 3/2010 | Futatsuyama ............ 365/185.17 |
| 2011/0292726 A1 * | 12/2011 | Lee et al. ................. 365/185.03 |

OTHER PUBLICATIONS

International Search Report and Written Opinion of the International Search Authority dated Jul. 2, 2012, PCT Application No. PCT/US2012/029553, filed Mar. 16, 2012, 12 pages.

* cited by examiner

*Primary Examiner* — Hoai V Ho
*Assistant Examiner* — Min Huang
(74) *Attorney, Agent, or Firm* — Vierra Magen Marcus LLP

(57) ABSTRACT

Methods and devices for sensing non-volatile storage devices in a way that reduces read disturb are disclosed. Techniques are used to reduce read disturb on memory cells that are neighbors to selected memory cells. For example, on a NAND string, the memory cells that are next to the selected memory cell presently being read may benefit. In one embodiment, when reading memory cells on a selected word line WLn, Vread+Delta is applied to WLn+2 and WLn−2. Applying Vread+Delta to the second neighbor word line may reduce read disturb to memory cells on the neighbor word line WLn+1.

23 Claims, 21 Drawing Sheets

REDUCING NEIGHBOR READ DISTURB

BACKGROUND

1. Field

This disclosure relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both traditional EEPROM and flash memory utilize a floating gate (FG) that is positioned above and insulated from a channel region in a semiconductor substrate. The floating gate is positioned between the source and drain regions. A control gate (CG) is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a read compare voltage $V_{CGRV}$ is applied to the control gate of a selected memory cell during a read operation. In some architectures, a read pass voltage (e.g., $V_{READ}$) is applied to control gates of unselected memory cells while the read compare voltage $V_{CGRV}$ is applied to the selected memory cell. The read pass voltage may be an appropriate magnitude to cause unselected memory cells to conduct.

Read disturb refers to undesirably altering the charge on a floating gate during a read operation. Altering the charge on the floating gate, alters the threshold voltage. With each read, the amount of disturb may be extremely small. However, after many reads, the effects may add up such that the threshold voltages are significantly altered. Note that in some cases, it may be unselected memory cells that suffer from read disturb.

DETAILED DESCRIPTION

Methods and devices for sensing non-volatile storage devices are disclosed. Technology disclosed herein may reduce read disturb. Note that as the scale of memory arrays decrease, read disturb may become an increasing problem. One reason for this is because for some architectures, decreasing the size of the memory cells results in a smaller window between each of the threshold voltage ranges that define each programmed state. Also, as the scale of memory arrays decrease, the space between word lines may decrease. This means that the space between the floating gate of a memory cell and its neighbor's control gate decreases. Therefore, the amount of capacitive coupling between a memory cell's floating gate and its neighbor's control gate may increase, as memory arrays scale to smaller sizes. This increase in capacitive coupling may increase the amount of read disturb.

In some embodiments, techniques are used to reduce read disturb on memory cells that are neighbors to selected memory cells. For example, on a NAND string, the memory cells that are next to the selected memory cell presently being read may benefit. In one embodiment, when reading memory cells on a selected word line, Vread+Delta is applied to the "second neighbor" word line to the selected word line. The term "second neighbor" as used herein refers to the neighbor to the neighbor. For example, if WLn is being read, the second neighbors are WLn+2 and WLn−2. In one embodiment, Vread may be applied to other unselected word lines. Applying Vread+Delta to the second neighbor word line may reduce read disturb to memory cells on the neighbor word line, as will be discussed more fully below.

Example Memory System and Operation

Figure 1A:
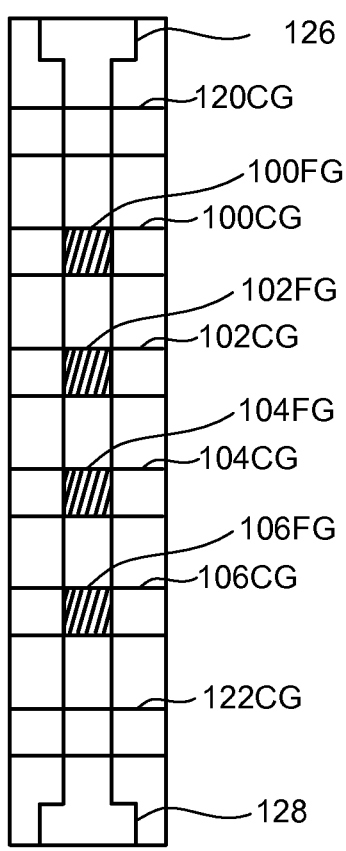
FIG. 1A is a top view of a NAND string.
Figure 1B:
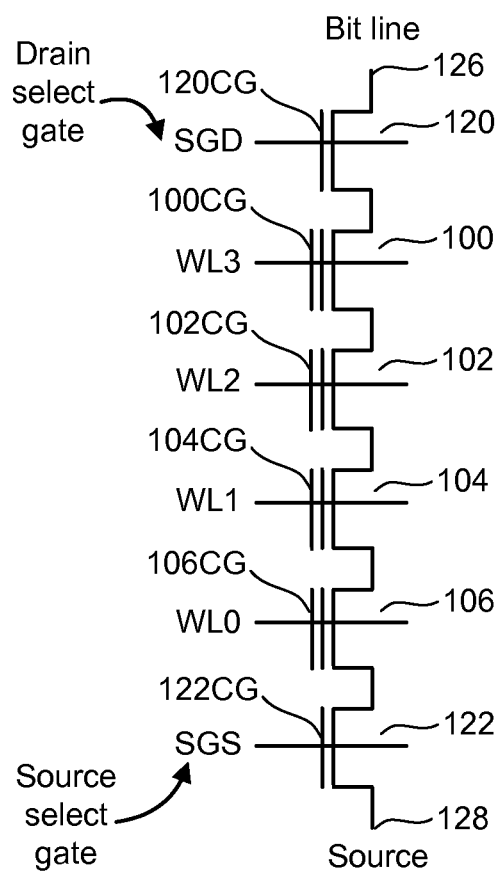
FIG. 1B is an equivalent circuit diagram of the NAND string of FIG. 1A.

One example of a memory system suitable for implementing embodiments uses a NAND flash memory architecture, which includes connecting multiple transistors in series between two select gates. The transistors connected in series and the select gates are referred to as a NAND string. FIG. 1A is a top view showing one NAND string. FIG. 1B is an equivalent circuit thereof. The NAND string includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

Figure 2:
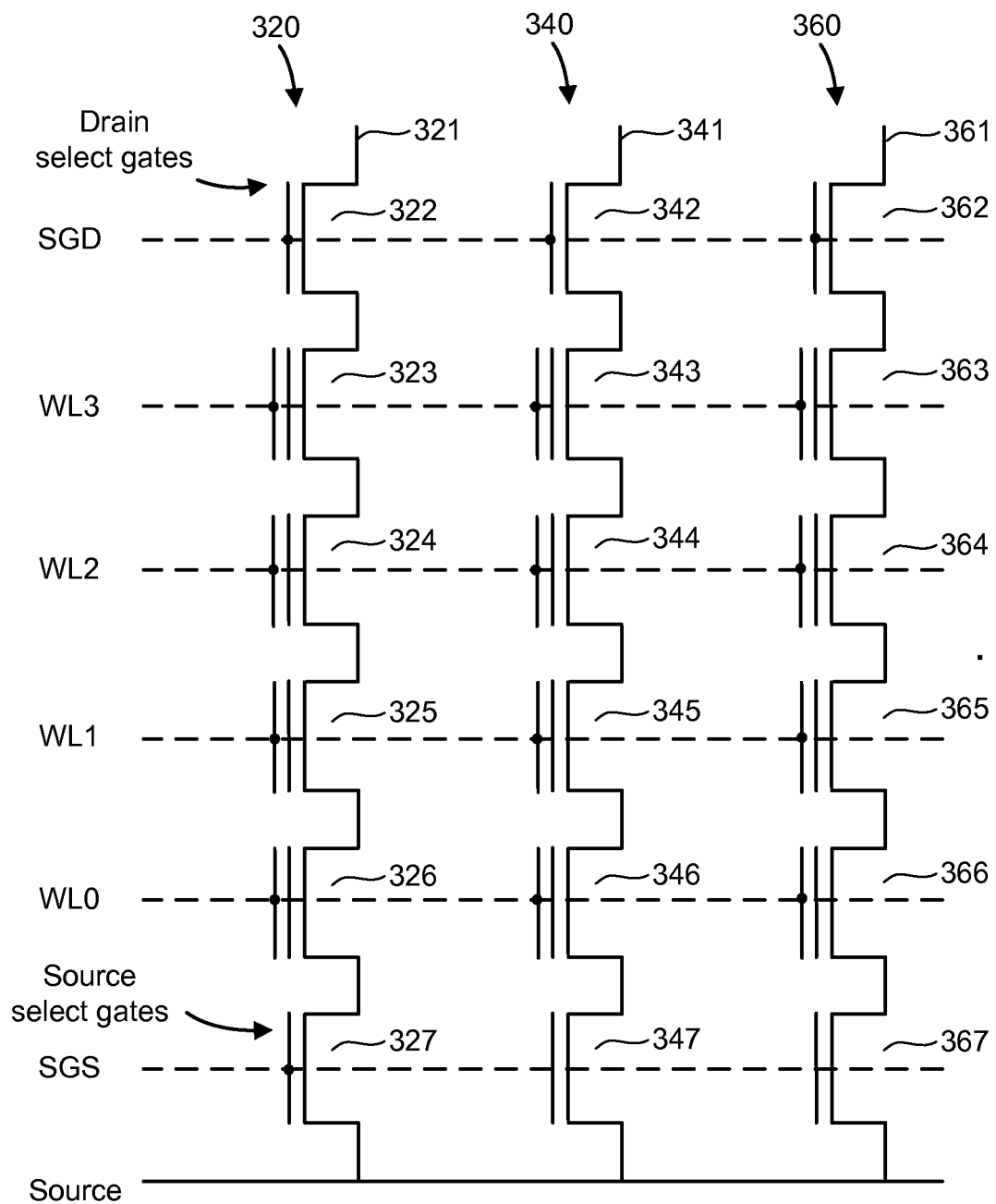
FIG. 2 is a circuit diagram depicting three NAND strings.

FIG. 2 is a circuit diagram depicting three NAND strings. A typical architecture for a flash memory system using a NAND structure will include many NAND strings. For example, three NAND strings 320, 340 and 360 are shown in a memory array having many more NAND strings. Each of the NAND strings includes two select gates and four storage elements. While four storage elements are illustrated for simplicity, NAND strings can have thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth. These select transistors are controlled by a drain select line SGD. In other embodiments, the select lines do not necessarily need to be in common among the NAND strings; that is, different select lines can be provided for different NAND strings. WL3 is connected to the control gates for storage elements 323, 343 and 363. WL2 is connected to the control gates for storage elements 324, 344 and 364. WL1 is connected to the control gates for storage elements 325, 345 and 365. WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation may be positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values may be used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2, the program voltage will also be applied to the control gates of storage elements 344 and 364.

Figure 3:
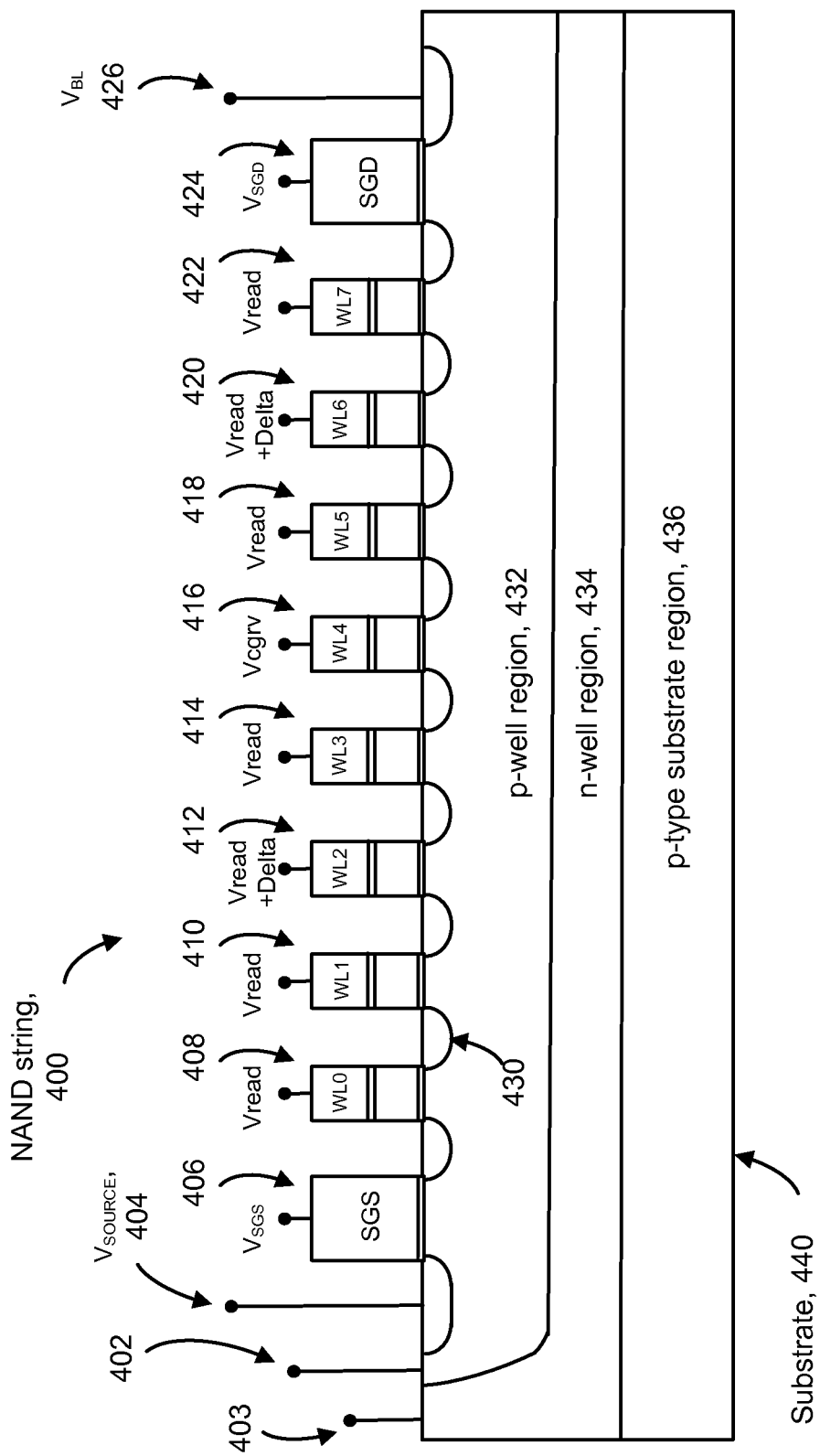
FIG. 3 depicts a cross-sectional view of a NAND string formed on a substrate.

FIG. 3 depicts a cross-sectional view of a NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 440. A number of source/drain regions, one example of which is source/drain region 430, are provided on either side of each storage element and the select gates 406 and 424.

In one approach, the substrate 440 employs a triple-well technology which includes a p-well region 432 within an n-well region 434, which in turn is within a p-type substrate region 436. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages, such as body bias voltages, can also be applied to the p-well region 432 via a terminal 402 and/or to the n-well region 434 via a terminal 403. During a read or verify operation, a control gate voltage $V_{CGRV}$ is provided on a selected word line, in this example, WL4, which is associated with storage element 416. Further, recall that the control gate of a storage element may be provided as a portion of the word line.

For example, WL0, WL1, WL2, WL3, WL4, WL5, WL6 and WL7 can extend via the control gates of storage elements 408, 410, 412, 414, 416, 418, 420 and 422, respectively. A pass voltage, $V_{READ}$ is applied to at least some of the remaining word lines associated with NAND string 400, in this embodiment. However, note that pass voltage $V_{READ}$+Delta is applied to the word lines two down from the selected word line. A reason for this is to reduce read disturb that might otherwise occur on the memory cells that immediately neighbor the selected memory cell. $V_{SGS}$ and $V_{SGD}$ are applied to the select gates 406 and 424, respectively.

Figure 4:
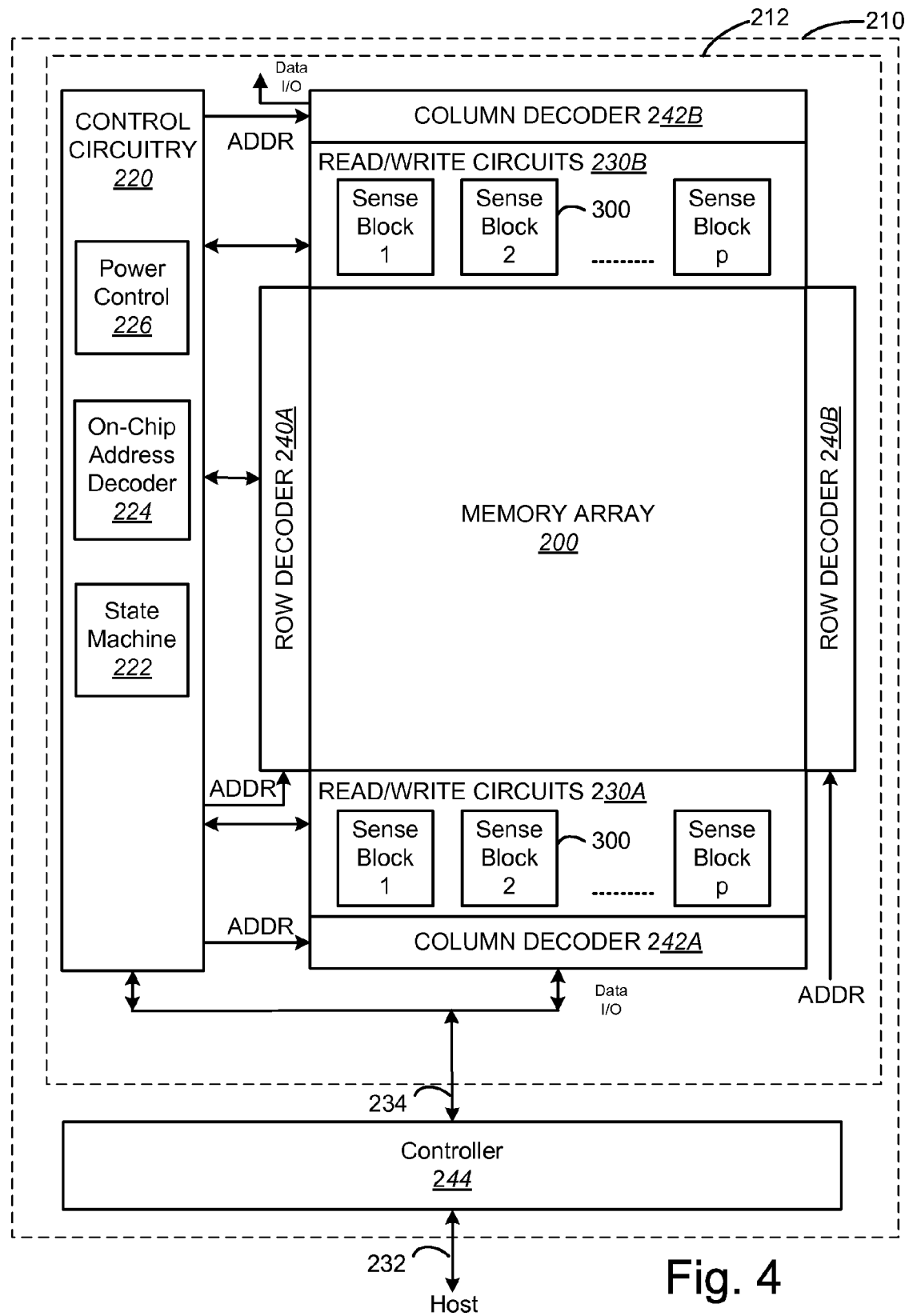
FIG. 4 illustrates a non-volatile storage device that may include one or more memory die or chips.

FIG. 4 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 5:
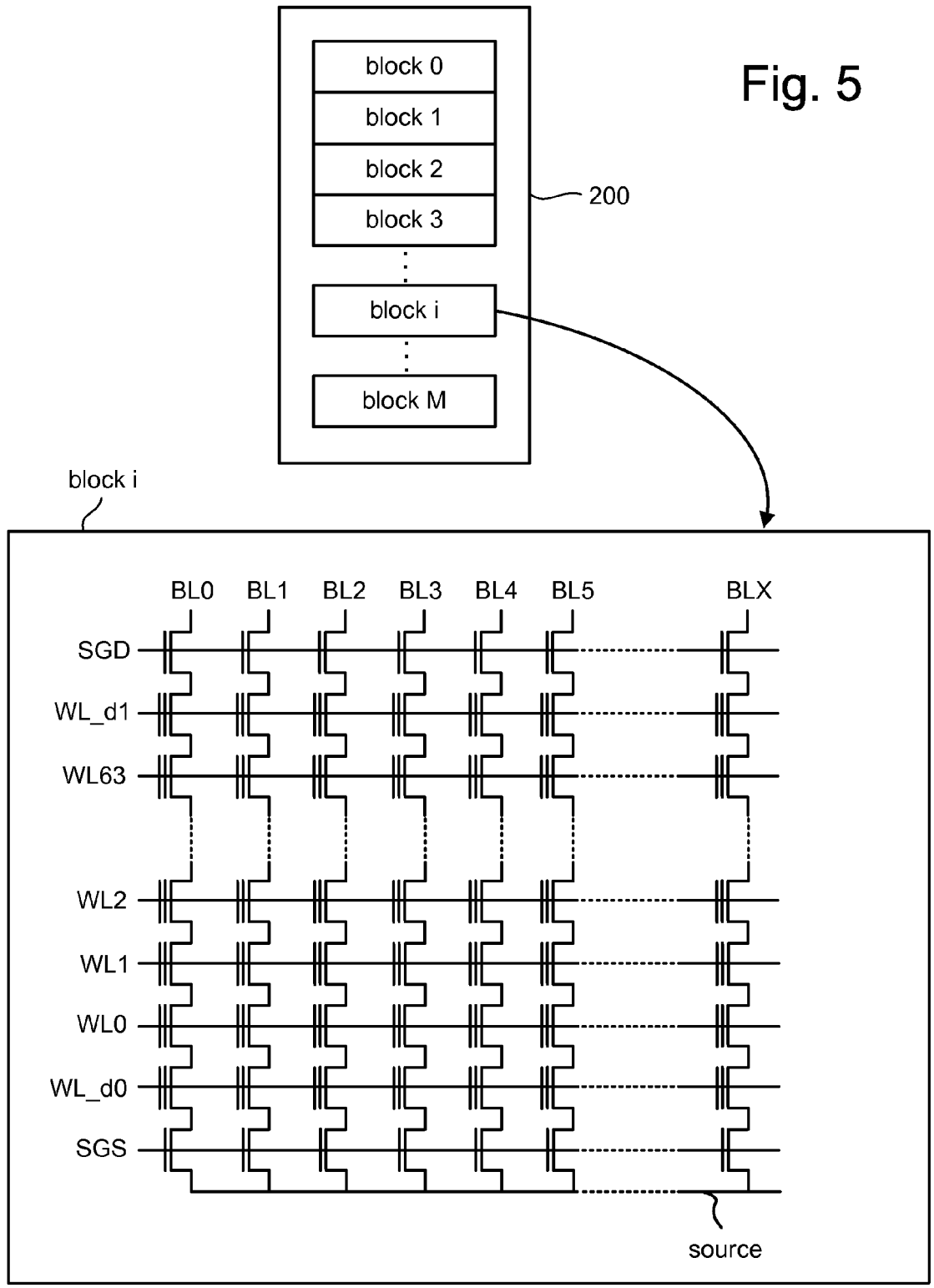
FIG. 5 depicts an exemplary structure of memory cell array.

FIG. 5 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5 also shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 6:
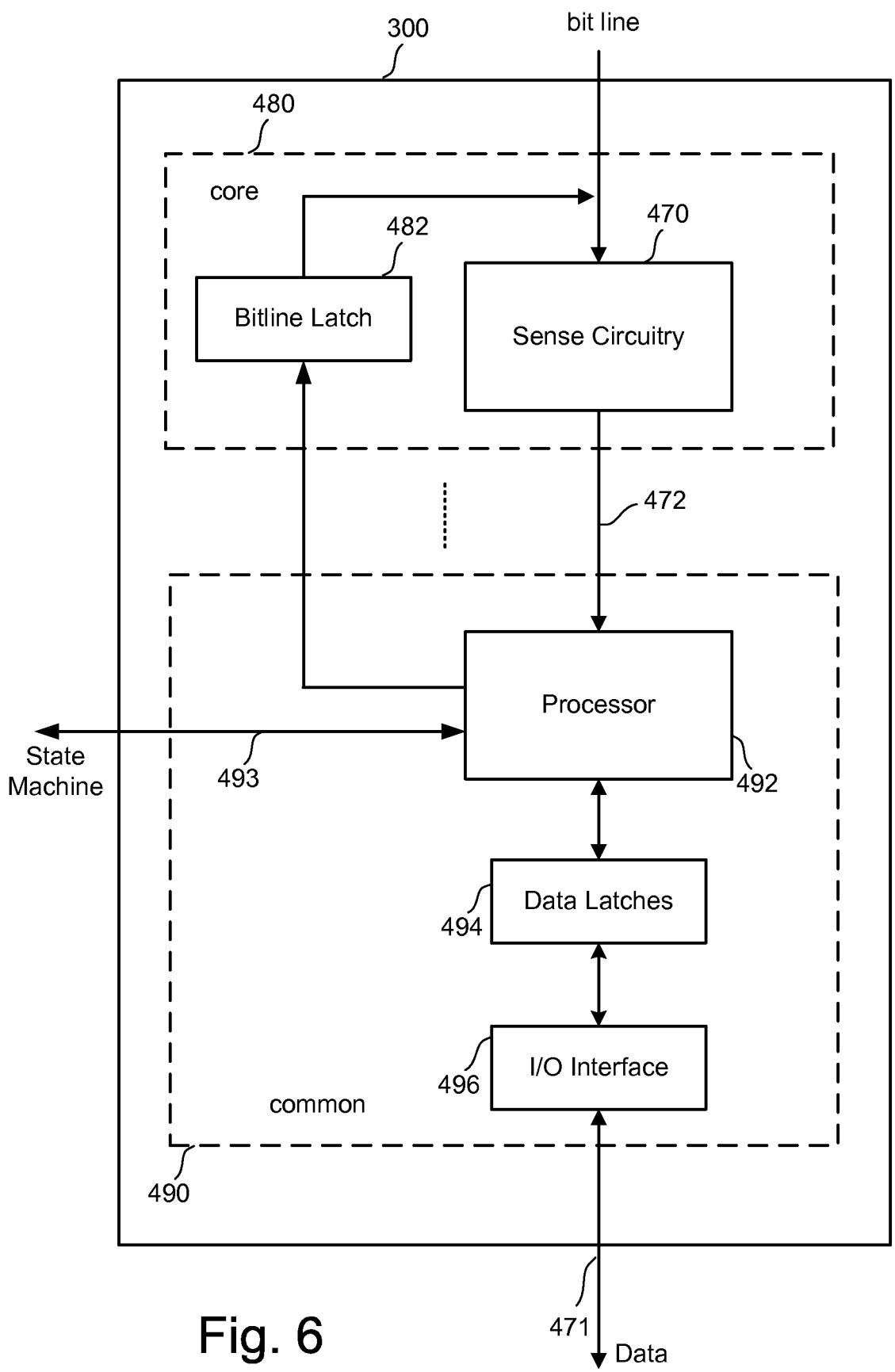
FIG. 6 is a block diagram of an individual sense block.

FIG. 6 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, filed Dec. 29, 2004, and titled, "Non-volatile memory and method with shared processing for an aggregate of read/write circuits," which is herby incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 471. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 471 during a program operation. The imported data bits represent write data meant to be programmed into the memory. I/O interface 496 provides an interface between data latches 494 and the data bus 471.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 6) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 471. The program operation, under the control of the state machine, comprises a series of programming voltage pulses (with increasing magnitudes) applied to the control gates of the addressed memory cells. Each programming pulse may be followed by a verify process to determine if the memory cell has been programmed to the desired state. Processor 492 monitors the verified memory state relative to the desired memory state. When the two are in agreement, processor 492 may set the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 471, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Figure 7:
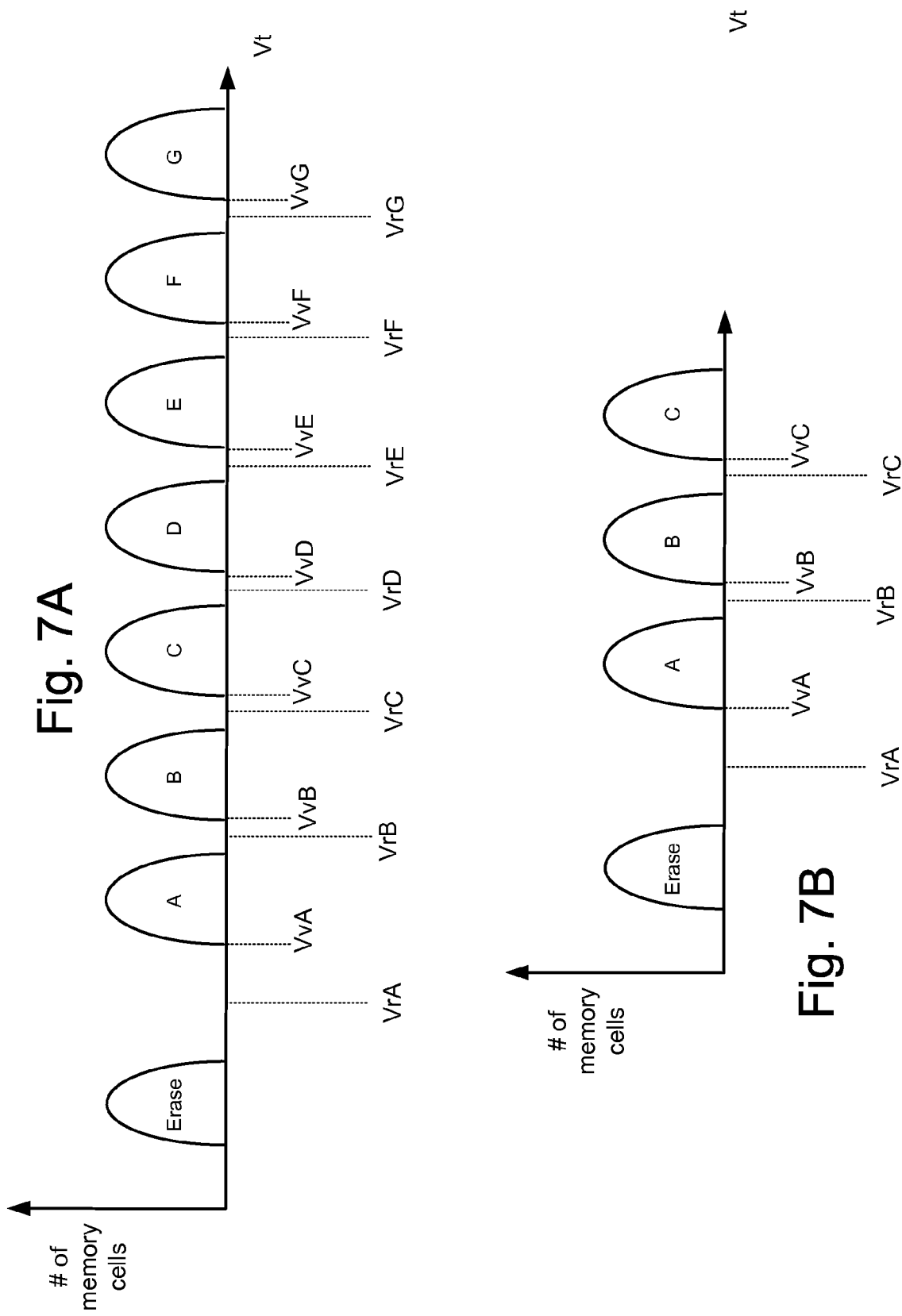
FIG. 7A depicts example threshold voltage distributions for states of memory cells in which there are eight states.
FIG. 7B illustrates example threshold voltage distributions corresponding to data states for the memory cell array when each memory cell stores two bits of data.

At the end of a successful programming process (with verification), the threshold voltages of the memory cells should be within one or more distributions of threshold voltages for programmed memory cells or within a distribution of threshold voltages for erased memory cells, as appropriate. FIG. 7A depicts example threshold voltage distributions for states of memory cells in which there are eight states. The eight data states include an erase state and states A-G. In this example, three bits may be stored per memory cell. Between each of the data states are read reference voltages used for reading data from memory cells. For example, FIG. 7A shows read reference voltage Vra between data states erase and A, and Vrb between data states A and B. By testing whether the threshold voltage of a given memory cell is above or below the respective read reference voltages, the system can determine what state the memory cell is in. At or near the lower edge of each data state are verify reference voltages. For example, FIG. 7A shows VvA for state A and VvB for state B, etc. When programming memory cells to a given state, the system will test whether those memory cells have a threshold voltage greater than or equal to the verify reference voltage.

FIG. 7B illustrates example threshold voltage distributions corresponding to data states for the memory cell array when each memory cell stores two bits of data. Other embodiments, however, may use more or fewer than two bits of data per memory cell.

Note also that although a distinct gap is depicted between each data state in FIGS. 7a and 7B, this may not be the case. For example, there may be some overlap between the threshold voltage distributions. In this case, error recovery may be used to correctly read the state of each memory cell.

Methods and Devices for Reducing Read Disturb

Figure 8:
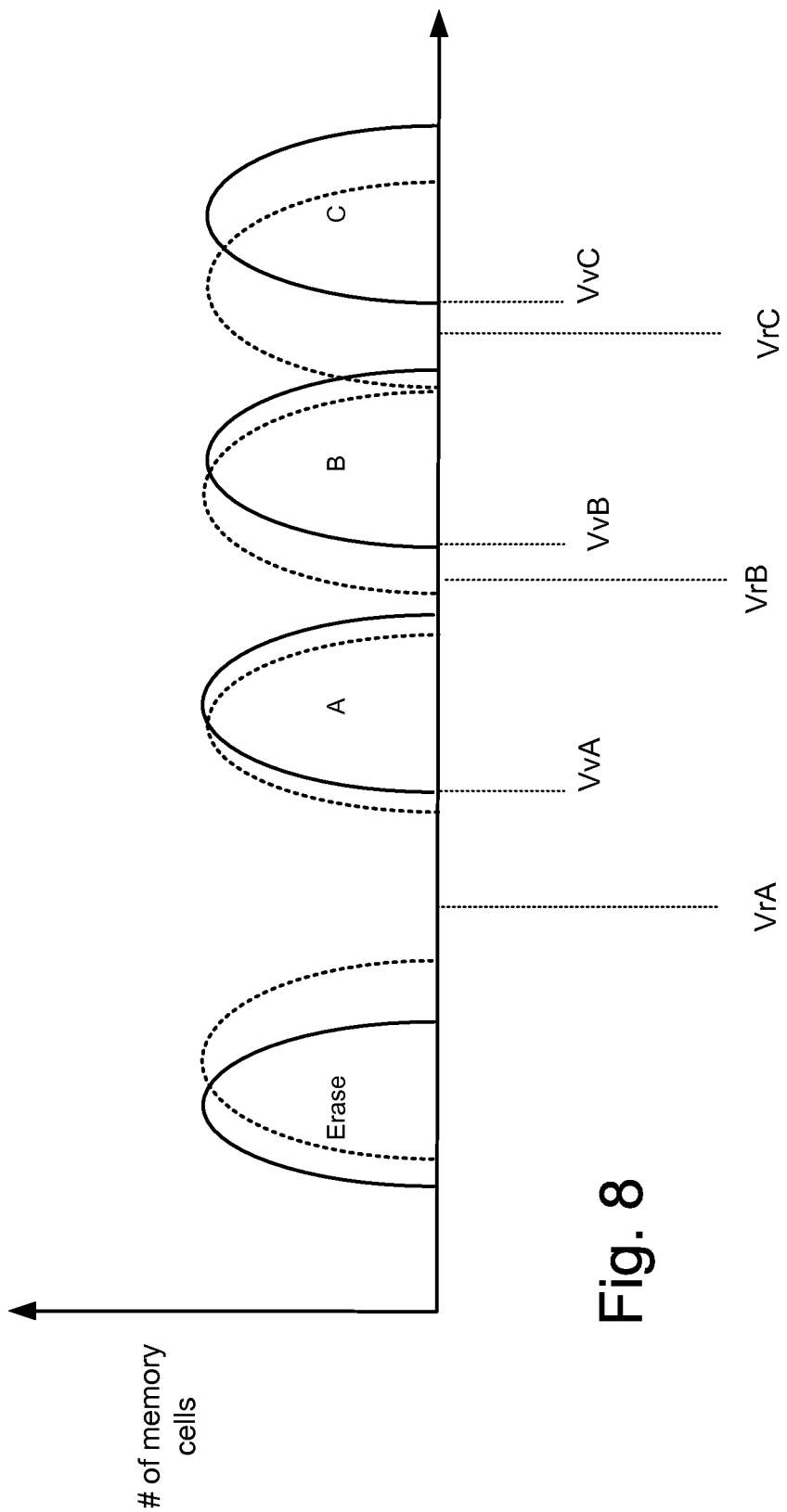
FIG. 8 depicts an example of how read disturb may affect the threshold voltage distributions.

Referring now to FIG. 8, an example of how read disturb may affect the threshold voltage distributions will be discussed. The solid curves correspond to the original distribution of threshold voltage ranges (states). The dashed curves correspond to shifts that may occur after many reads due to read disturb. In this example, the highest state is impacted by read disturb more than the other states. However, for some architectures this might not be the case. In this example, the threshold voltages of the erased memory cells are moved upwards (towards the A-state) as a result of read disturb.

Note that error recovery might be used to accurately read the state of memory cells provided that not too many have had their threshold voltages moved outside of their target range. However, it can be desirable to not rely too much on error recovery. Also, if there is too much read disturb, error recovery may not be able to recover the data.

Figure 9:
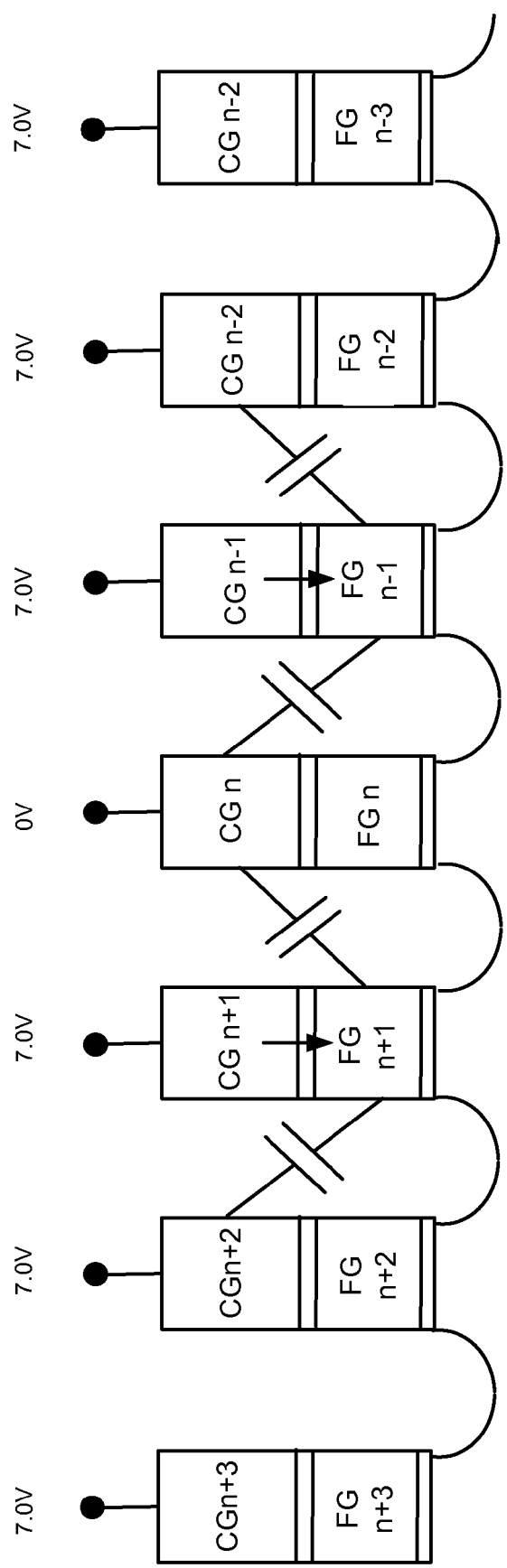
FIG. 9 shows example voltages being applied to control gates to show how read disturb might arise.

Referring to FIG. 9, an example will be discussed on how read disturb might occur. FIG. 9 depicts a portion of the NAND string of FIG. 3, with example voltages being applied to control gates. The selected memory cell has its floating gate labeled FGn and its control gate labeled CGn. The selected memory cell may be referred to as memory cell n. Unselected memory cells are referred to by n+1, n+2, etc. depending on their relative location to the selected memory cell. For the sake of illustration, the voltage Vcgrv applied to the control gate of the selected memory cell will be 0V and the voltages Vread applied to control gates of unselected memory cells will be 7.0V. There is some coupling between the control gate of the selected memory cell and the floating gate of the immediate neighbor memory cells (CG to neighbor FG coupling). Note that the FG of memory cells that are neighbors to the selected memory cell experiences a different amount of the coupling compared to FG of memory cells that are neighbors to unselected memory cells.

For example, referring to FIG. 9, 0V is applied to the control gate (CGn) of the selected memory cell and a 7.0V Vread is applied to control gate of all other unselected memory cells. The FG of every unselected memory cell has a certain amount of capacitive coupling with the CG of its neighbors. For example, FGn+1 of memory cell n+1 has CG-to-neighbor FG coupling to control gates CGn and CGn+2. Likewise, FGn−1 of memory cell n−1 has CG-to-neighbor FG coupling to control gates CGn and CGn−2. These CG-to-neighbor FG coupling effects are represented by capacitors. Capacitors for CG-to-neighbor FG coupling for other memory cells are not depicted.

However, note because the selected memory cell has 0V on its CG, then CG-to-neighbor FG coupling effect reduces FG potential of memory cells n+1 and n−1 compared to FG potential of other unselected memory cells. A net result of lower FG potential of memory cells n+1 and n−1 is that memory cells n+1 and n−1 may suffer a greater read disturb by IPD leakage than other unselected memory cells. This IPD leakage read disturb may result from the increase in electric field (direction of electric field shown by arrows) for n+1 and n−1 due to the reduction in FG potential of n+1 and n−1 due to selected memory cell at 0V. This IPD leakage for memory cells n+1 and n−1 results in loss of electrons from their FGs to their CGs which reduces the memory cell's threshold voltage.

Note that the greater the potential difference between a memory cell's FG and CG, the more significant the IPD leakage may be. Note that for memory cell's n+1 and n−1, the CG-to-neighbor FG coupling may result in a greater potential difference between the memory cell's FG and CG than for the other unselected memory cells (other factors being equal). A reason for this is that the 0V applied to the selected CG may pull down the voltage on the FG of the neighbor. This may increase the leakage current across the IPD only of the neighbors (e.g., n+1, n−1) and not of the remaining unselected memory cells.

Also note that the lower the potential of the memory cell's FG to begin with, the greater the potential difference will be between the memory cell's FG and CG. Note that memory cells that have been programmed to a higher state may have a lower FG potential to begin with. Thus, this IPD leakage read disturb may be worse for memory cells n+1 and n−1 that have been programmed to a higher state.

Figure 10:
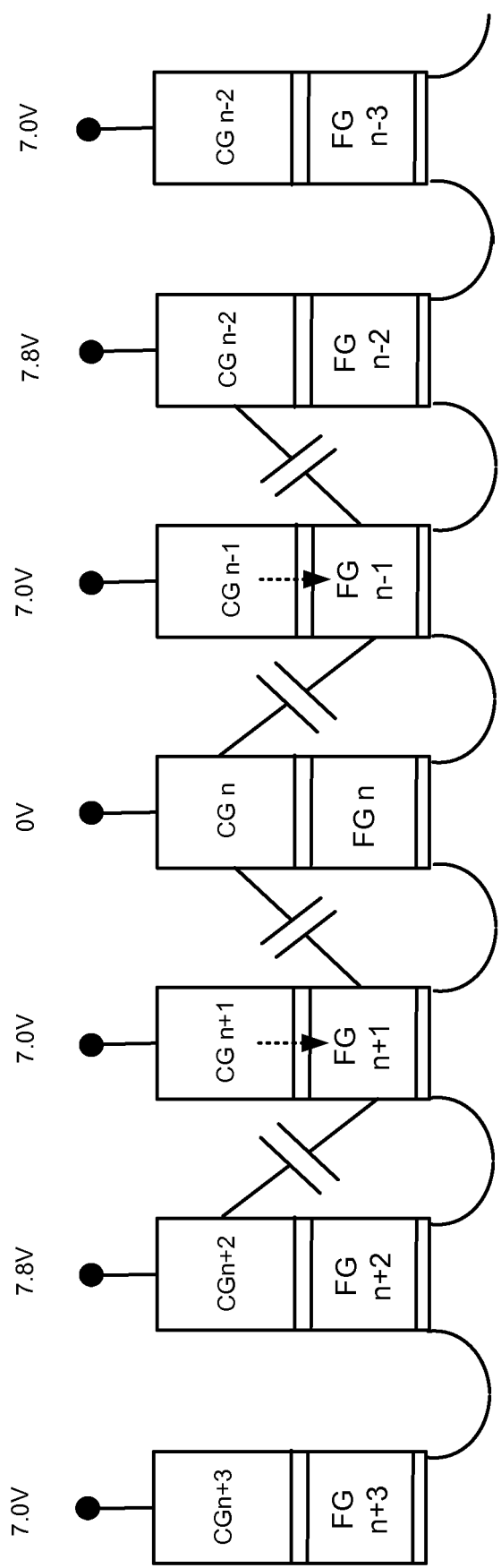
FIG. 10 depicts a portion of the NAND string of FIG. 3, with example voltages being applied to control gates to reduce read disturb, in accordance with one embodiment.

In one embodiment, a greater read pass voltage is applied to the control gates of memory cells n+2 and n−2 in order to reduce read disturb of memory cell n+1. For example, referring to FIG. 10, 7.8V may be applied to control gates CGn+2 and CGn−2, instead of the normal read pass of 7.0V applied to other unselected control gates. Note that this means that this changes the CG-to-neighbor FG coupling for FGn+1 relative to the example in FIG. 9. Likewise, this changes the CG-to-neighbor FG coupling for FG−1. Specifically, CGn+2 pulls up the voltage of FGn+1 more in this case than for the example in FIG. 9. This may reduce the electric field across the IPD for memory cell n+1. In other words, this may reduce the potential difference between CGn+1 and FGn+1. Thus, the IPD leakage current may be reduced, which may reduce read disturb. Similar reasoning applies to memory cell n−1.

Figure 11A:
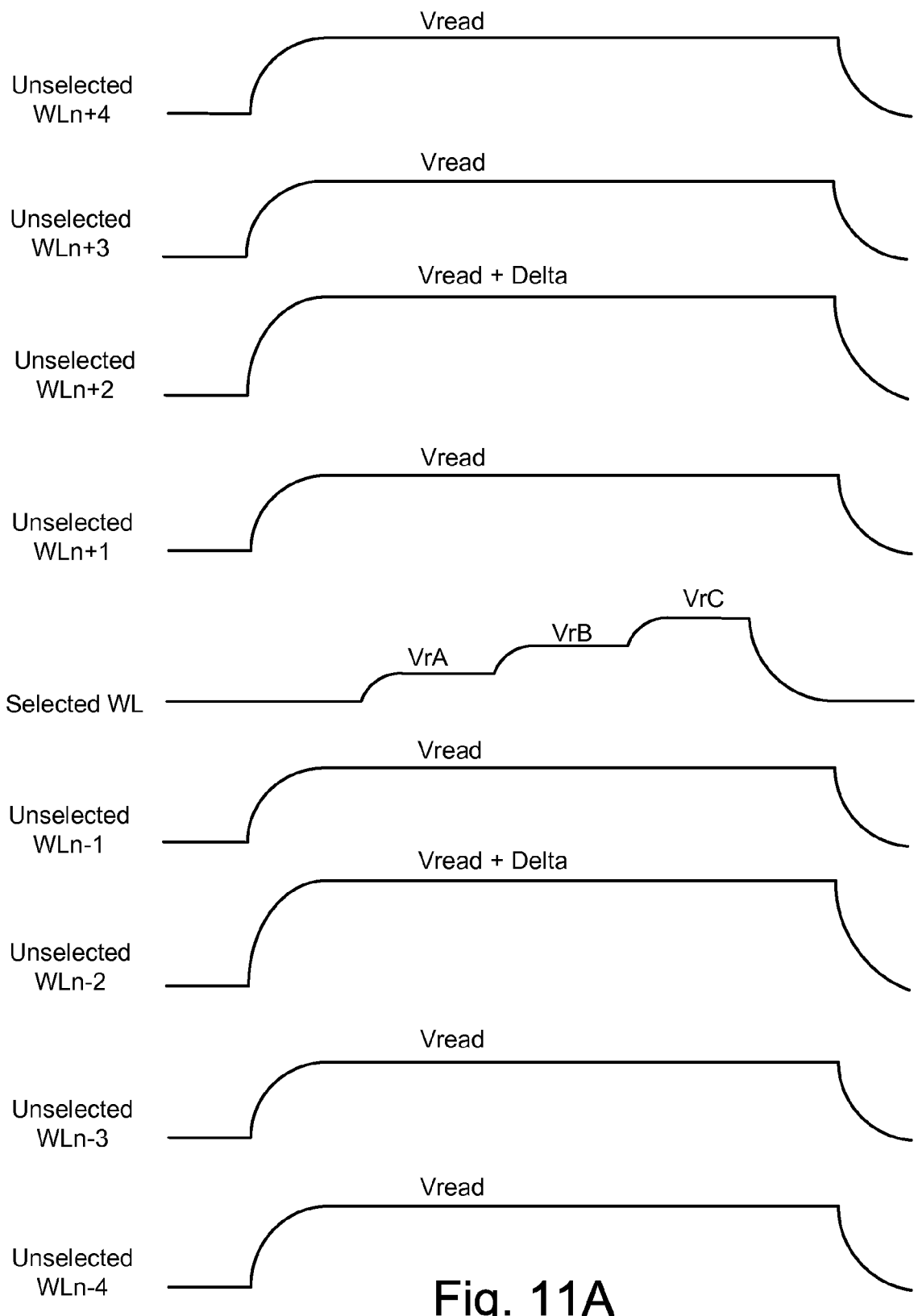
FIG. 11A depicts voltages applied to various word lines during one embodiment of a read operation that reduces read disturb on a neighbor memory cell.

More generally, voltages applied to the word lines during a read operation may be as depicted in FIG. 11A. FIG. 11A depicts voltages applied to various word lines during a sense operation, such as a read operation. Voltages are depicted for a selected word line (WL) and four unselected neighboring word lines (WLn−4 to WLn+4). In this example, the word lines n+m may be closer to the drain side (for example, they may be closer to SGD in FIG. 2). The word lines n−m may be closer to the source side (e.g., SGS). Typically there are many more unselected word lines than depicted in FIG. 11A. In some cases, the selected word line may be close to the end of a NAND string, in which case there may be fewer than four neighbors to either the drain or source side.

Three read compare voltages (VrA, VrB, VrC) are depicted for the selected word line. These may correspond to VrA, VrB, VrC from FIG. 7B. In this example, these voltages are applied from low to high, but another sequence may be used. Also note that the read operation is not required to apply all of the read compare voltages to the selected word line. For example, if a single page is being read, then possibly only VrB might be applied.

In this embodiment, Vread+Delta is applied to unselected word lines WLn+2 and WLn−2. In this example, Delta may be a positive voltage such that Vread+Delta is greater than Vread. All other unselected word lines may have Vread applied thereto, in this example. In this example, the voltage Vread+Delta is applied to WLn+2, WLn−2 while all read compare voltages are applied to the selected word line. That is, Vread+Delta is applied while VrA, VrB, and VrC are applied to the selected word line. In other embodiments, Vread+Delta is only applied while some subset of the read compare voltages are applied.

In this embodiment, Vread+Delta is applied to both WLn+2 and WLn−2. However, in one embodiment, Vread+Delta is applied to WLn+2 but not to WLn−2. For example, Vread may be applied to WLn−2. In one embodiment, Vread+Delta is applied to WLn−2 but not to WLn+2. Rather, Vread may be applied to WLn+2.

Reducing Tunnel Oxide Read Disturb of Neighbor

Note that under some conditions, applying Vread+Delta to the CG of the second neighbor could impact tunnel oxide related read disturb of the neighbor. Tunnel oxide related read disturb may occur due to voltage differences between the FG and the channel of a memory cell. For some devices and states, the greater the FG potential, the greater the amount of this type of read disturb. For example, for some devices, when a memory cell is erased its threshold voltage is negative. Hence, the FG may be at a positive voltage. The channel may be at 0V, at least under certain conditions. If the FG voltage of such an erased memory cell is increased, then the electric field across the tunnel oxide increases. This may result in tunneling across oxide causing more electrons to tunnel into the FG. The net effect is to increase the threshold voltage of the memory cell and shift the erase state memory cells towards the A-state.

Consequently, applying Vread+Delta on n+2 and n−2 may reduce IPD leakage related read disturb on n+1 and n−1 (at least under some conditions), but may increase tunnel oxide related read disturb on n+2 and n−2 (at least under some conditions). Note that for some devices, applying Vread+Delta on n+2 and n−2 provides the greatest benefits for reducing IPD leakage related read disturb on n+1 and n−1 when reading lower states on selected WLn. For example, the greatest benefit may occur when the lowest read voltages are applied to the selected CG. One possible reason for this is that when a higher read compare voltage is applied to the selected word line the neighbor's FG is not pulled down as much. This may result in less of a difference between the CG and FG of the neighbor (compared to reading with a lower read compare voltage). The net result is that there may be less IPD leakage read disturb when reading higher memory states. Consequently, in one embodiment, Vread+Delta is only applied to WLn+2 (and WLn−2) for lower state reads. Therefore, benefits of reducing IPD leakage related read disturb may be achieved when reading lower states. Moreover, tunnel oxide related read disturb is also reduced by reducing exposure to higher bias Vread+Delta to WLn+2 (and WLn−2).

Figure 11B:
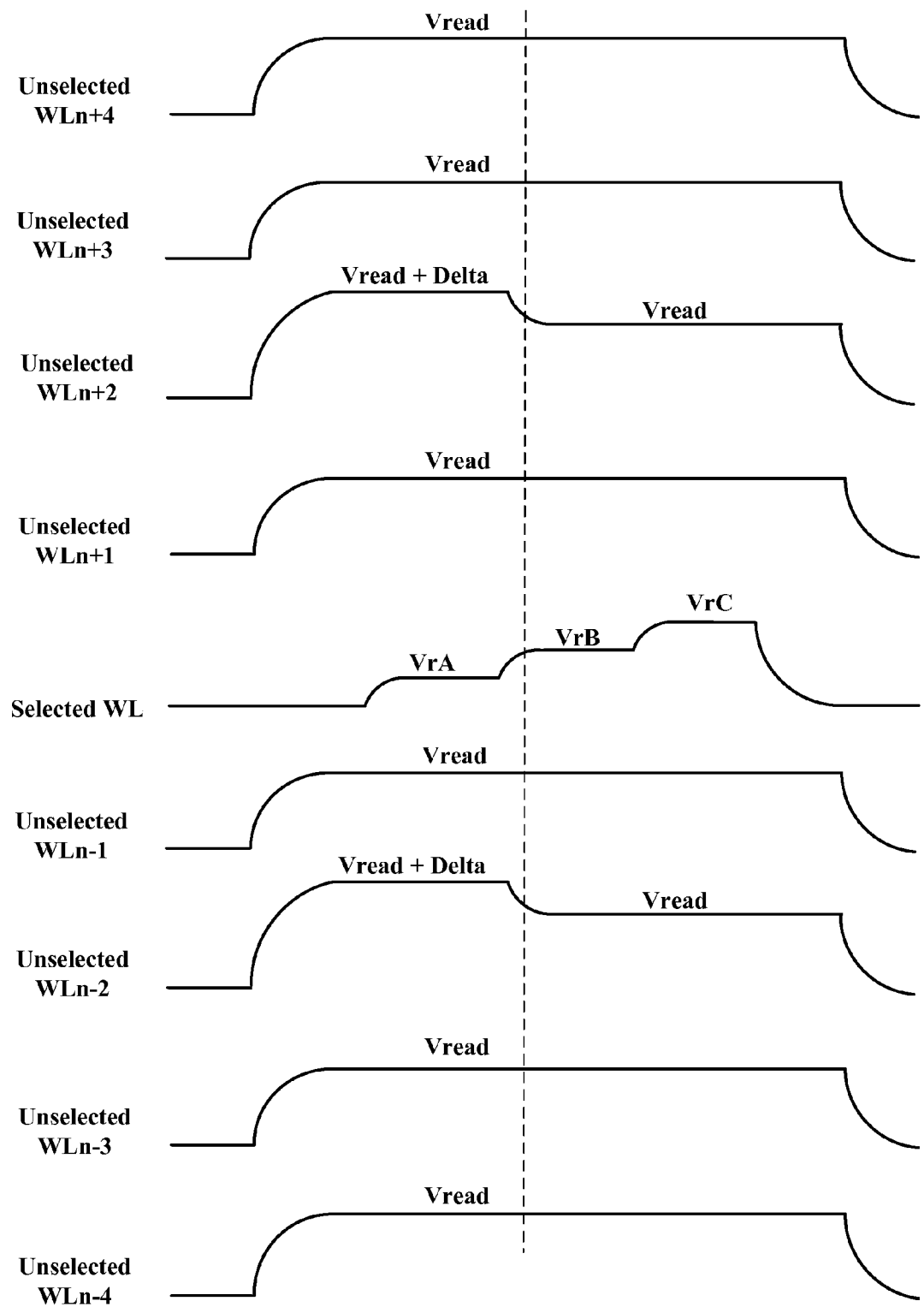
FIG. 11B depicts voltages applied to word lines during one embodiment of a read operation that reduces read disturb on a neighbor memory cell when reading a lower state.

FIG. 11B depicts voltages applied to word lines during a read operation for an embodiment in which Vread+Delta is applied to WLn+2 during the A-state read (e.g., when Vra is applied to the selected word line). However, the voltage on WLn+2 is reduced to Vread during reads of higher states. In this example, Vread is applied to WLn+2 when Vrb and Vrc are applied to the selected word line. In another embodiment, Vread+Delta is also applied to WLn+2 during the B-state read (e.g., when Vrb is applied to the selected word line), but not when Vrc is applied to the selected word line.

Note that the read operation could have more than three read compare voltages. For example, if there are eight states (as in FIG. 7A), then the read operation might have seven read compare voltages. In one embodiment, Vread+Delta is applied to the second neighbor when reading some subset of lower states, but Vread is applied to the second neighbor when reading the rest of the states. The determination of when to apply Vread+Delta to the second neighbor may be made based on balancing considerations between IPD leakage read disturb and tunnel oxide leakage related read disturb. Factors such as IPD and tunnel oxide thickness, spacing between WLs, magnitudes of read compare voltages, magnitude of the normal read pass voltage, etc. may impact when Vread+Delta should be applied to the second neighbor. For example, for some device architectures with eight or more states, Vread+Delta might be applied when applying Vra, Vrb, and Vrc to the selected control gate, but not for higher read compare voltages. For another device, Vread+Delta might be applied for only Vra.

Further Increasing Potential of Neighbor FG to Reduce Read Disturb

Figure 12A:
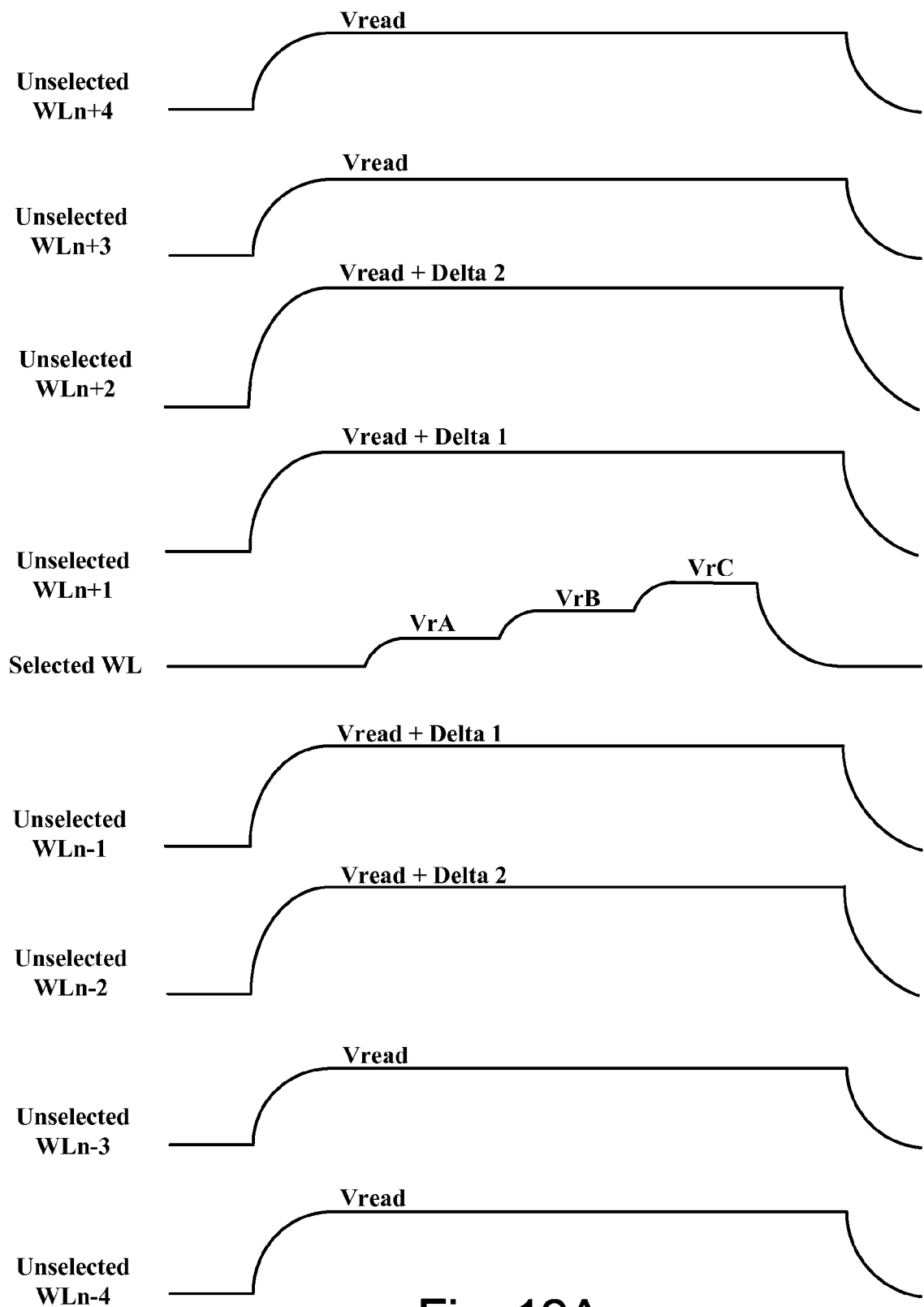
FIGS. 12A-12B depict voltages applied to word lines during a read operation for embodiments that reduces read disturb.

In one embodiment, the read pass voltage applied to the neighbor word lines n+1 and n−1 is increased relative to the normal read pass voltage in order to reduce the amount by which read pass voltage on n+2 and n−2 WLs is increased. This may serve to further increase the voltage on the floating gate of the neighbor. FIG. 12A depicts voltages applied to word lines during a read operation for an embodiment in which Vread+Delta1 is applied to WLn+1 (and WLn−1) and Vread +Delta2 is applied to WLn+2 (and WLn−2). In one embodiment, Delta1 is zero volts. In one embodiment, Delta1 is non-zero, but is less than Delta2. In this case, Delta 2 will be less than Delta as shown in FIG. 11B.

Figure 12B:
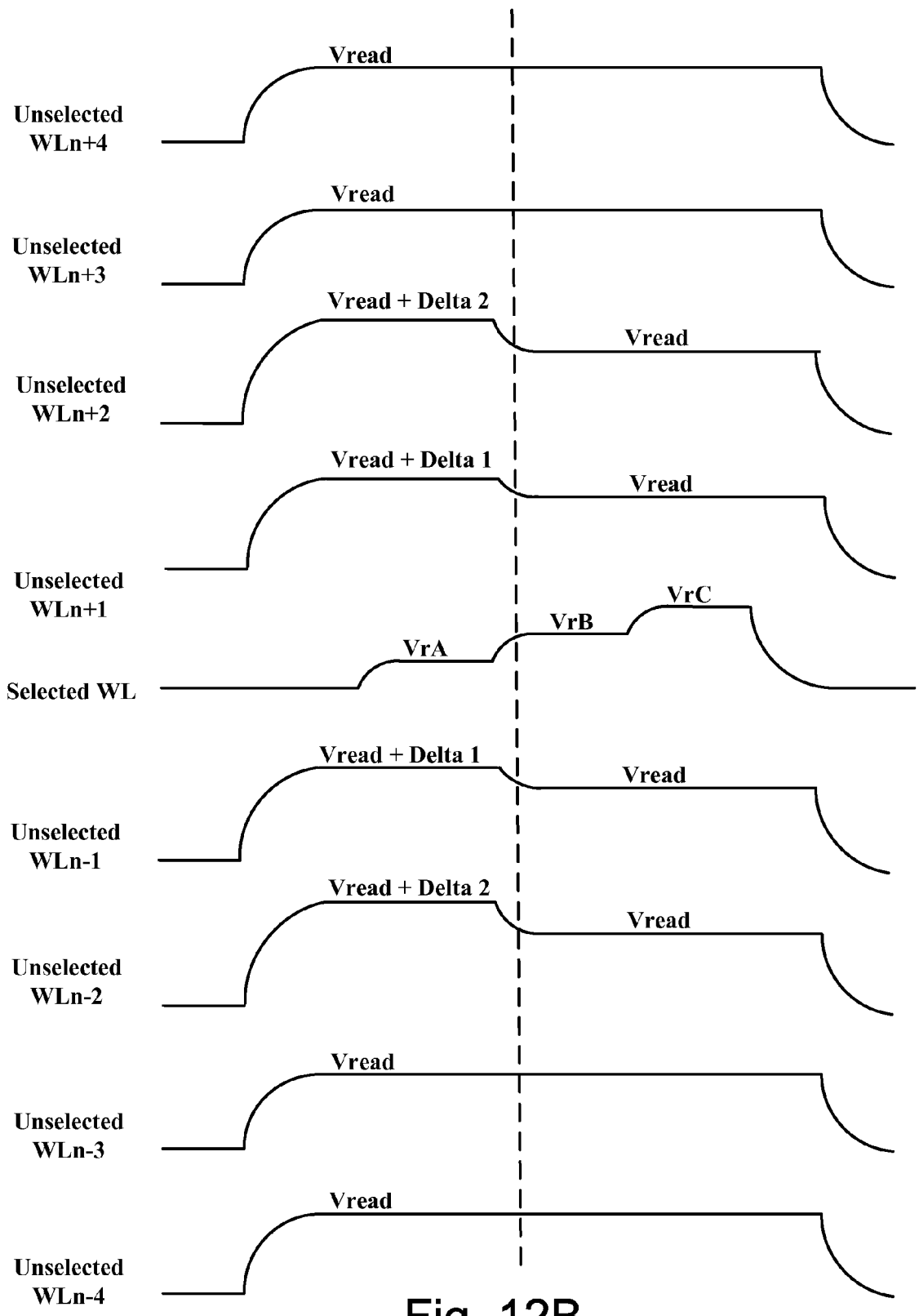

In the example of FIG. 12A, the deltas are applied for all read compare voltages. However, the deltas can be applied for some subset of the read compare voltages. FIG. 12B shows word line voltages during a read operation. In one embodiment, the subset is lower read compare voltages. This might be the lowest read compare voltage, the two lowest, etc.

Reducing Tunnel Oxide Read Disturb of Second Neighbor

Note that increasing the read compare voltage on the second neighbor may increase the floating gate potential of the second neighbor itself. This may be due to capacitive coupling between the second neighbor control gate and the second neighbor floating gate. Raising the FG potential may, under some circumstances, increase tunnel oxide related read disturb. For example, if the second neighbor is in the erased state, it may have a negative threshold voltage. In other words, its FG may be at a positive voltage. If the FG potential is raised further, then tunnel oxide related read disturb could be increased.

Figure 13A:
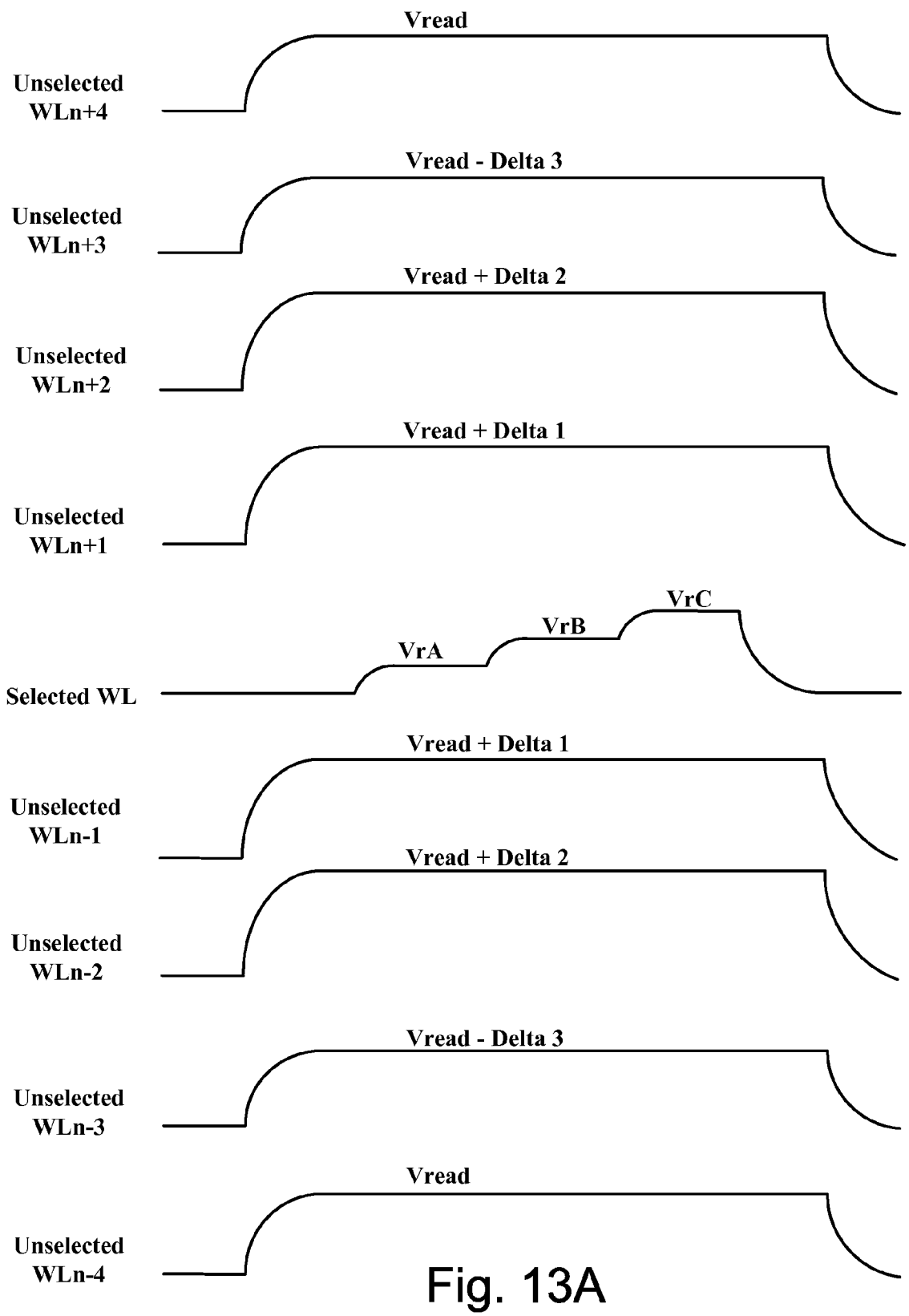
FIGS. 13A-13B depict word line voltage during embodiments of a read operations that reduces read disturb on both a first neighbor and a second neighbor to a selected memory cell.

In one embodiment, the read pass voltage on the third neighbor is decreased relative to the normal read pass voltage. This may serve to reduce the aforementioned tunnel oxide related read disturb on the second neighbor. FIG. 13A depicts word line voltage during one embodiment of a read operation. In this embodiment, Vread+Delta1 is applied to the first neighbor, Vread+Delta2 is applied to the second neighbor, and Vread−Delta3 is applied to the third neighbor. Delta1 may be zero volts. Thus, note that the voltage on WLn+1 may simply be Vread. The absolute magnitude of Delta3 may be the same as, less than, or greater than Delta2. However, note that Delta3 may be positive, such that the read pass voltage on the third neighbor is less than Vread. In other words, the read pass voltage on WLn+2 may be increased, whereas the read pass voltage on WL+3 may be decreased relative to a normal Vread. In this example, the normal Vread may be applied to other unselected word lines (e.g., WLn+4, WLn+5, etc., as well as WLn−4, WLn−5, etc.). The delta voltages may be applied to neighbors on one side or both sides of the selected word line. When applied on one side, this may be either the source or the drain side.

Figure 13B:
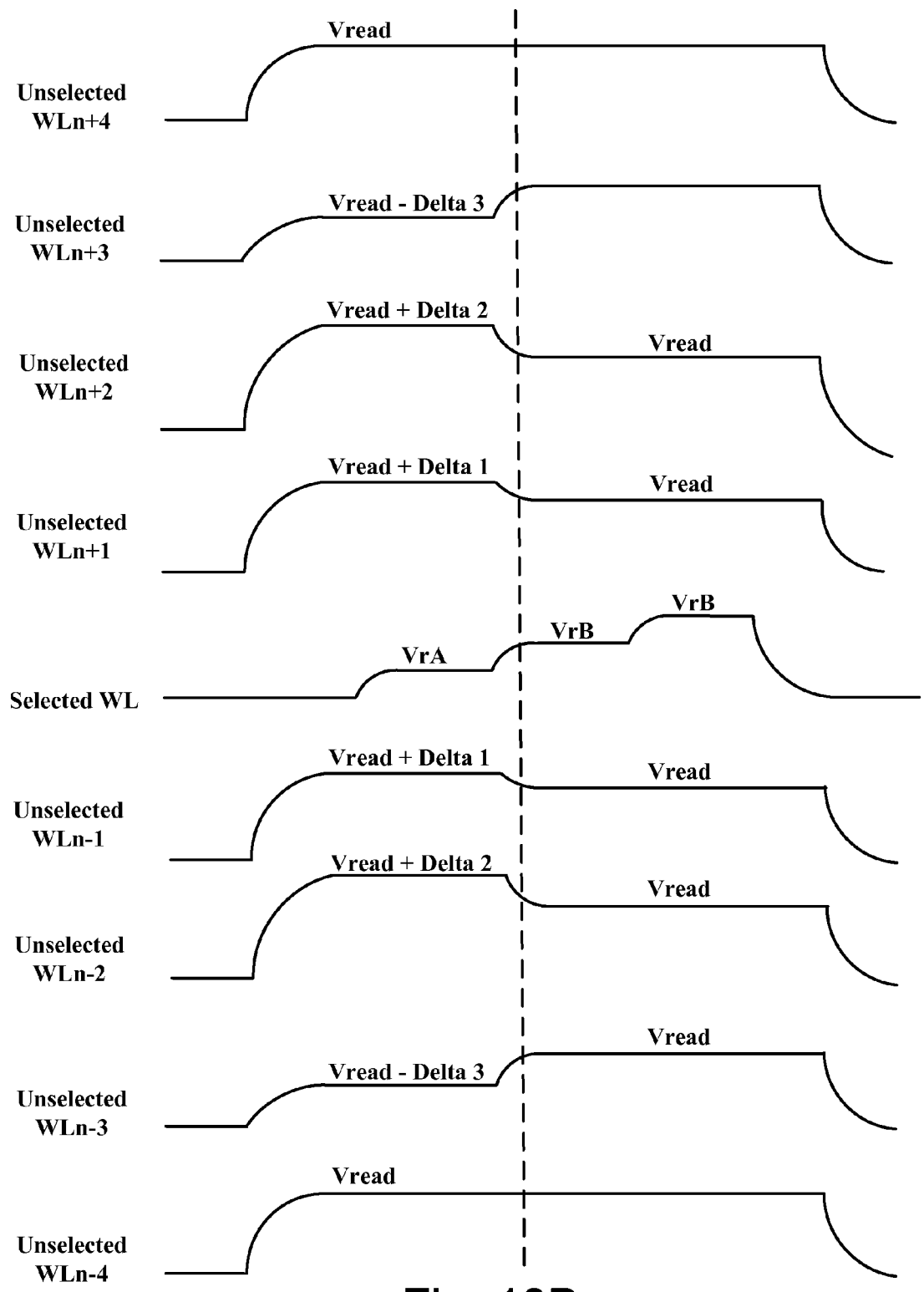

FIG. 13B is similar to FIG. 13A, but is for an embodiment in which the Deltas are only applied when reading at the lower read compare voltages. In this example, the Deltas are applied for Vra, but not other read compare voltages. Note that the Deltas could apply for some other set of read compare voltages. In one embodiment, the Delta voltages are used when reading a subset of lowest read compare voltages.

Reducing Back Bias Effect

Note that if a lower read pass voltage is used on the third neighbor word line this may lead to a back bias effect, under some conditions. For example, lowering the control gate potential of WLn+3 may prevent that memory cell from conducting as strong a current as it should for a read pass voltage. For example, lowering the CG potential of memory cell n+3 may decrease the current flowing through the channel of memory cell n+3 (e.g., the transistor may not turn on as strongly). Therefore, the resistance of the NAND string increases which makes the threshold voltage of selected cell appears higher due to back bias effect.

Figure 14A:
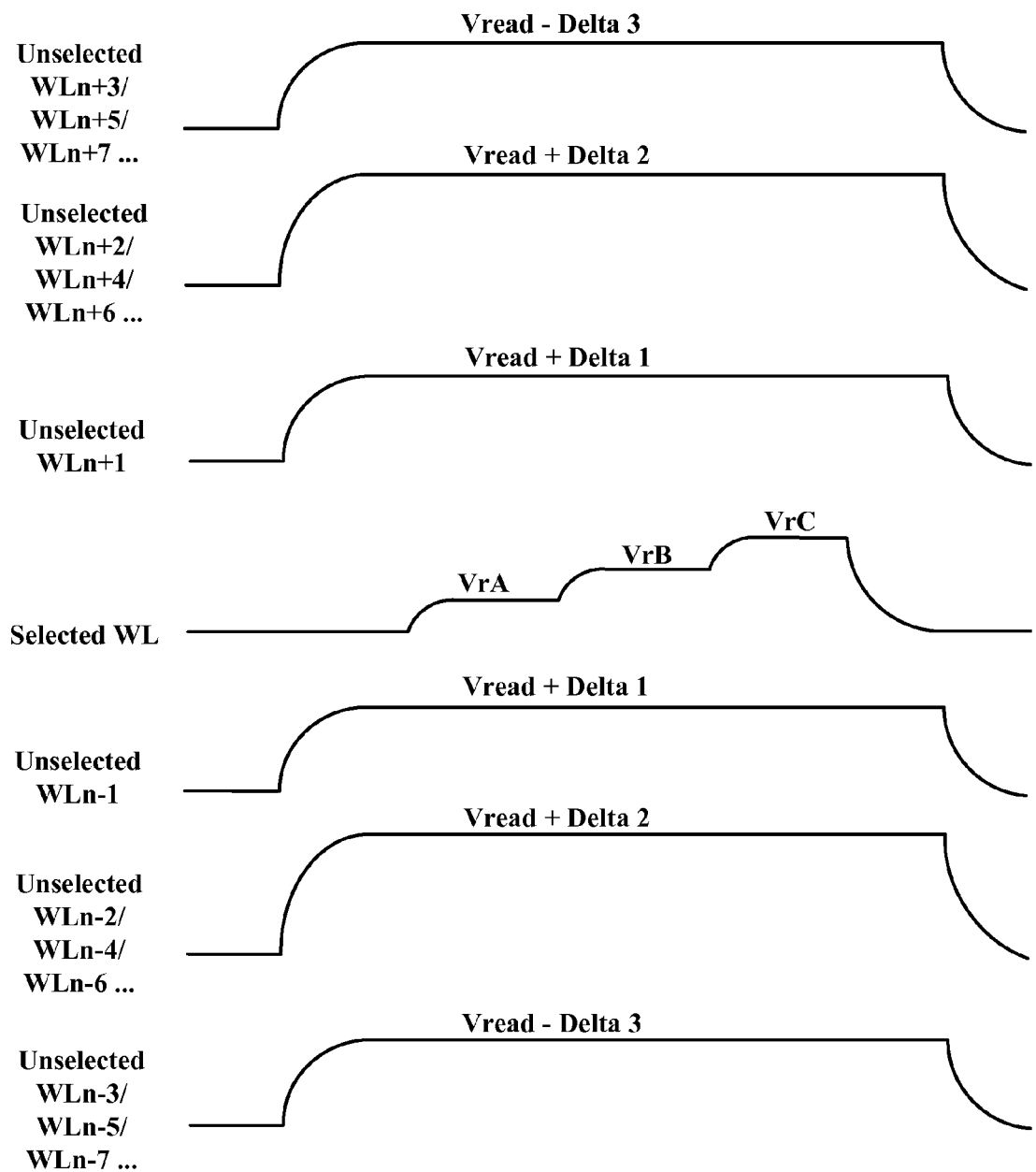
FIGS. 14A-14B depict word line voltage during embodiments of a read operations that reduces read disturb and counter back bias effect.

In order to compensate for this back bias effect, a scheme such as depicted in FIG. 14A may be used. In this embodiment, Vread+Delta2 is applied to WLn+2, WLn+4, WLn+6, etc. Furthermore, Vread−Delta3 may be applied to WLn+3, WLn+5, WLn+7, etc. Similar voltages may be applied to unselected word lines on the other side of the selected word line. In this embodiment, Vread+Delta1 may be applied to WLn+1 (and to WLn−1). Delta1 may be 0V. Thus, in effect, the voltage applied to WLn+1 (and to WLn−1) may be Vread. Delta1 may also be a positive voltage that is less than Delta2 that is applied to WLn+2. Delta3 applied to WLn+3 may be greater than, the same as, or less than, Delta2 that is applied to WLn+2.

By applying a higher read pass voltage to WLn+4, the back bias effect to memory cell n+3 may be reduced or eliminated. However, applying a higher read pass voltage to WLn+4 may increase the tunnel oxide read disturb on memory cell n+4 under certain conditions. However, this may be compensated by applying a lower read pass voltage to WLn+5. In other words, the voltage to WLn+5 may be Vread-Delta3. This pattern may be repeated for up to all of the word lines.

Note that it is not required that Delta2 be the same value for all of the WLn+2, WLn+4, WLn+6, etc. word lines. For example, Delta2 could be smaller for word lines further from the selected word line. Likewise, it is not required that Delta3 be the same value for all of the WLn+3, WLn+5, WLn+7, etc. word lines. For example, Delta3 could be smaller in absolute magnitude for word lines further from the selected word line. In other words, the tunnel oxide read disturb effects, as well as the back bias effects, may be less significant for memory cells that are further from the selected memory cell.

Also note that it is not required that some Delta2 be applied to every word line between the selected word line and the source and drain select lines. For example, a Vread+Delta2 might be applied to WLn+2, WLn+4, WLn+6, but not for WLn+8, etc. Likewise, it is not required that a Vread+Delta3 be applied to every word line between the selected word line and the source and drain select lines. For example, a Vread+Delta3 might be applied to WLn+3, WLn+5, WLn+7, but not for WLn+9, etc.

Figure 14B:
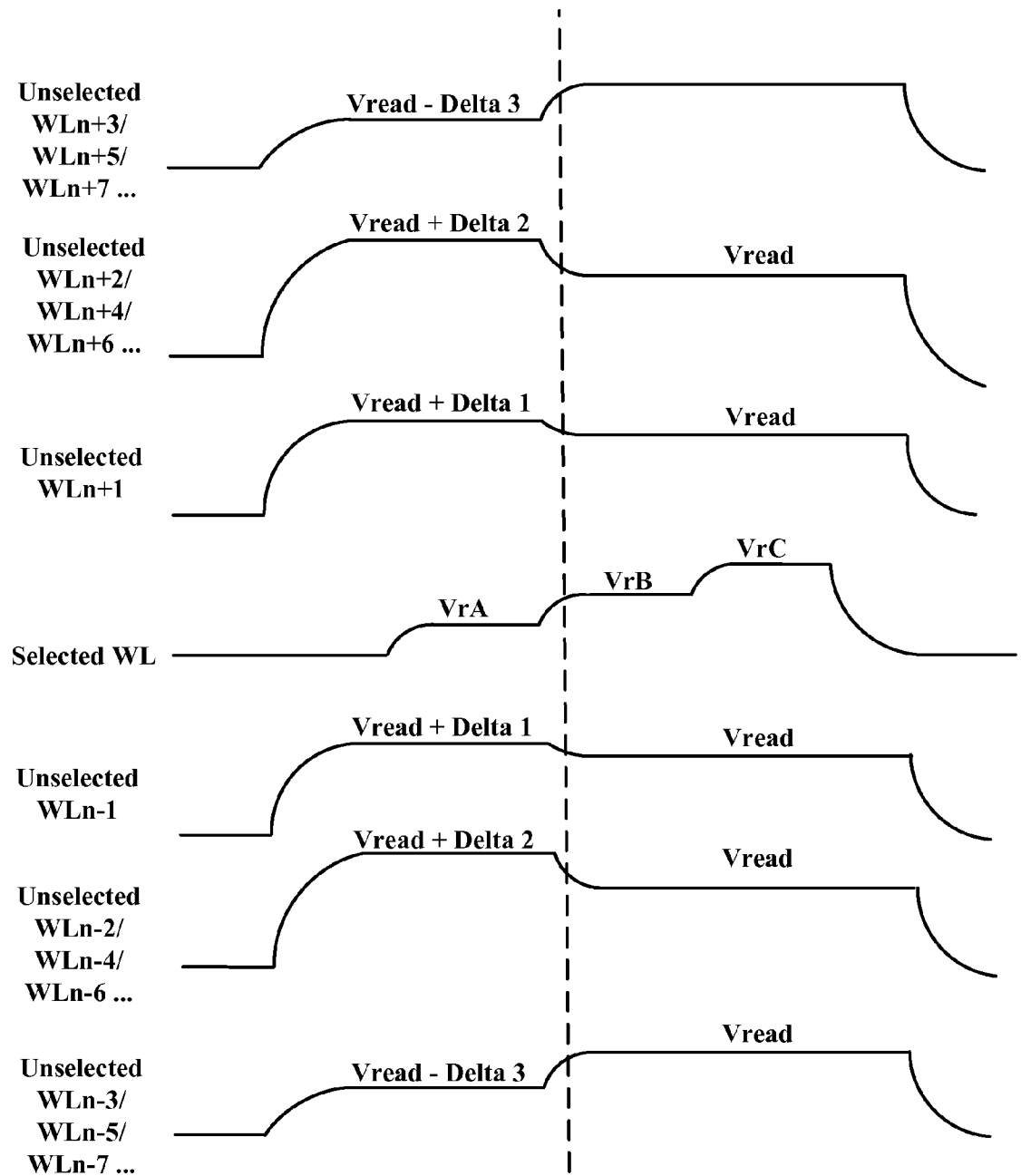

FIG. 14B is similar to FIG. 14A, but is for an embodiment in which the Deltas are only applied when reading at the lower read compare voltages. In this example, the Deltas are applied for Vra, but not other read compare voltages. Note that the Deltas could be applied to some other group of lower read compare voltages.

Example Read Operations

Figure 15:
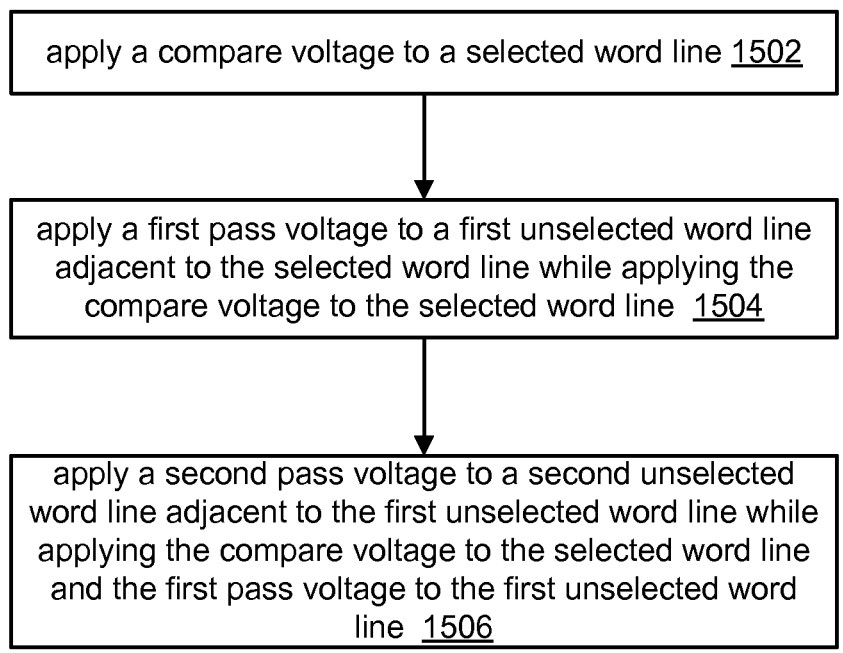
FIG. 15 is a flowchart of one embodiment of a process 1500 of a read operation that reduced read disturb.

FIG. 15 is a flowchart of one embodiment of a process 1500 of a read operation that reduced read disturb. Process 1500 includes applying various voltages to word lines which may reduce read disturb. In some cases, read disturb on the neighbor memory cell is reduced. Note that no order should be implied from the order in which the steps of process 1500 is described. Reference will be made to FIGS. 11A-14B, as any of those example voltages may be applied to word lines during process 1500. Note that process 1500 is not limited to those examples.

In step 1502, a read compare voltage is applied to a selected word line. As one example, the voltage Vra is applied to WLn. However, the read compare voltage could be any read compare voltage.

In step 1504, a first pass voltage is applied to a first unselected word line adjacent to the selected word line, while applying the read compare voltage to the selected word line. The first unselected word may also be referred to as a first neighbor. As one example, Vread is applied to WLn+1, as in the examples of FIGS. 11A and 11B. As another example, Vread+Delta1 is applied to WLn+1, as in the examples of FIGS. 12A-14B. The first pass voltage might be also be applied to WLn−1. In one embodiment, the first pass voltage is applied to WLn−1, but a different voltage is applied to WLn+1.

In step 1506, a second pass voltage is applied to a second unselected word line adjacent to the first unselected word line. This occurs while applying the read compare voltage to the selected word line and while applying the first pass voltage to the first unselected word line. The second unselected word may also be referred to as a second neighbor. The magnitude of the second read pass voltage may be greater than the magnitude of the first read pass voltage.

As one example, Vread may be applied to WLn+1 and Vread+Delta may be applied to WLn+2, as depicted in the examples of FIGS. 11A and 11B. In this example, Vread may be applied to other unselected word lines. In other words, the voltage applied to WLn+2 may be greater than the voltage to other unselected word lines. The second pass voltage might be also be applied to WLn−2. In one embodiment, the second pass voltage is applied to WLn−2, but a different voltage is applied to WLn+2.

As another example, Vread+Delta2 may be applied to WLn+2 with Vread+Delta1 applied to WLn+1, as depicted in FIGS. 12A-12B. As noted above, Delta1 might be 0V or some voltage that is less than Delta2. As still another example, Vread+Delta2 may be applied to WLn+2 with Vread+Delta1 applied to WLn+1 and Vread−Delta3 as depicted in FIGS. 13A-13B. As still another example, Vread+Delta2 may be applied to WLn+2, WLn+4, WLn+6, etc. Vread+Delta1 may applied to WLn+1. And Vread−Delta3 may be applied to WLn+3, WLn+5, WLn+7, etc. This example is depicted in FIGS. 14A-14B. Note that process 1500 is not limited to these examples.

Note that when applying these voltages to the first and second unselected word lines, the voltage applied to at least some of the other unselected word lines may be lower than the voltage that is applied to WLn+2. For example, in FIGS. 11A-13B, a normal read pass voltage may have a lower magnitude than the voltage applied to the second unselected word line. In FIGS. 13A-14B, the voltage Vread-Delta3 may have a lower magnitude than the voltage applied to the second unselected word line. Also note that the voltage on the third neighbor word line may be less than the voltage on the second neighbor word line. This condition may hold true whether the third neighbor word line has Vread or Vread-Delta3 applied.

Figure 16A:
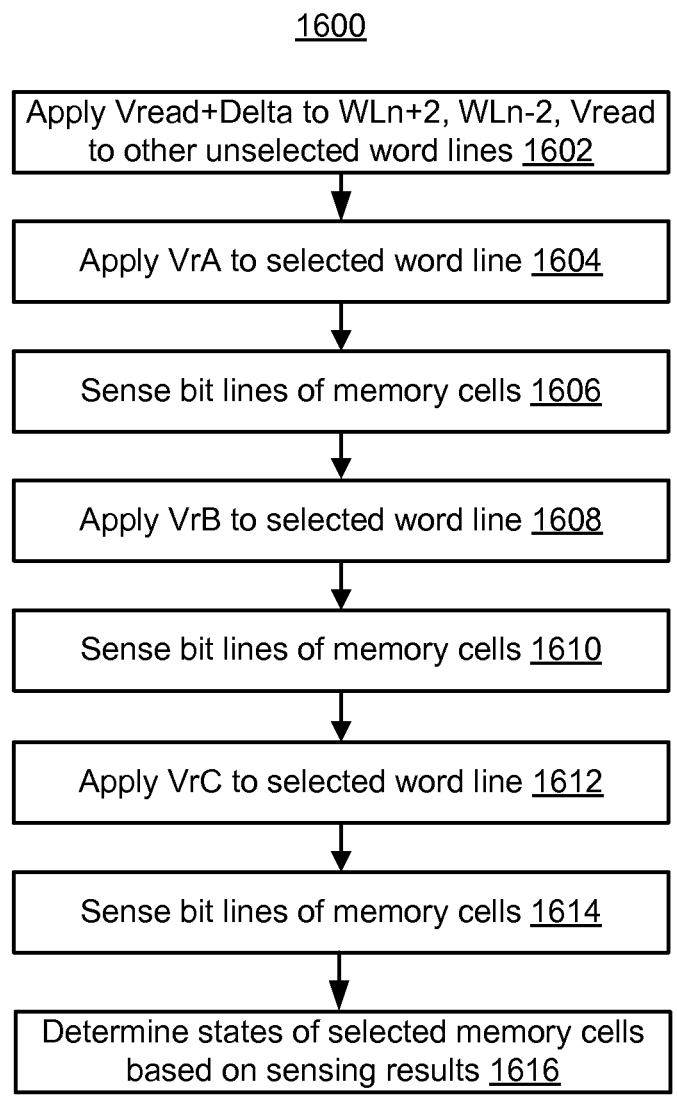
FIGS. 16A-16B are flowchart that depict further details of read operations that reduce read disturb on a neighbor memory cell.

FIG. 16A is a flowchart that depicts further details of a read operation that reduces read disturb on a neighbor memory cell. The process 1600 of FIG. 16 is one embodiment of process 1500. Process 1600 covers a read operation having three read compare voltages, but can be extended to cover read operations with more or fewer compare operations. FIG. 11A depicts example waveforms associated with process 1600. In step 1602, Vread+Delta is applied to WLn+2, while Vread is applied to other unselected word lines.

In step 1604, Vra is applied to a selected word line. In step 1606, bit lines are sensed. Note that the result of sensing may be stored. The sensing may include using circuitry that is described in general in the discussion of FIG. 6.

In step 1608, Vrb is applied to the selected word line. In some embodiments, step 1608 is achieved by raising the voltage from Vra to Vrb. Note that the voltage on the unselected word lines may remain the same as in step 1602. In step 1610, bit lines are again sensed.

In step 1612, Vrc is applied to the selected word line. In some embodiments, step 1612 is achieved by raising the voltage from Vrb to Vrb. Note that the voltage on the unselected word lines may remain the same as in step 1602. In step 1614, bit lines are again sensed. The state of the selected memory cells on the selected word line may then be determined in step 1616 by analyzing the results of the various sense operations.

Figure 16B:
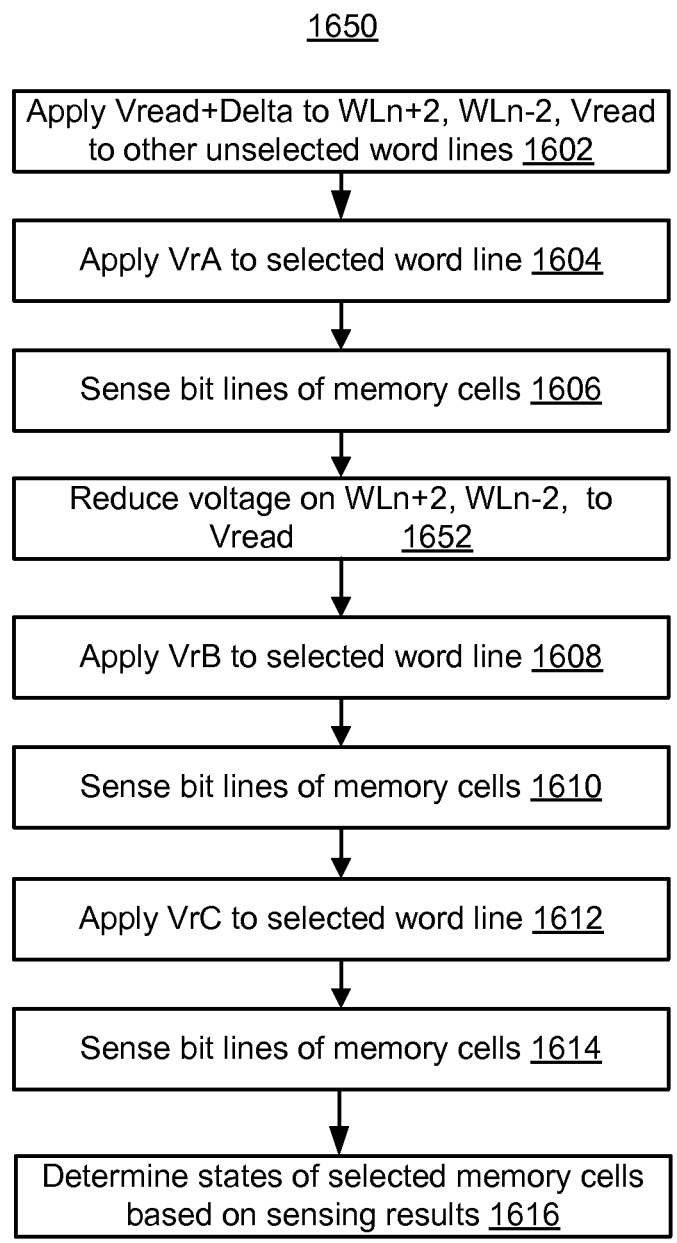

FIG. 16B is a flowchart that depicts further details of a read operation that reduces read disturb on a neighbor memory cell. The process 1650 of FIG. 16B is one embodiment of process 1500. Process 1650 covers a read operation have three read compare voltages, but can be extended to cover read operations with more or fewer compare operations. FIG. 11B depicts example waveforms associated with process 1650. In step 1602, Vread+Delta is applied to WLn+2, while Vread is applied to other unselected word lines.

In step 1604, Vra is applied to a selected word line. In step 1606, bit lines are sensed. Note that the result of sensing may be stored. The sensing may include using circuitry that is described in general in the discussion of FIG. 6.

In step 1652, the voltage on WLn+2 is reduced to Vread. In step 1608, Vrb is applied to the selected word line. In some embodiments, step 1608 is achieved by raising the voltage from Vra to Vrb. Note that the change of voltages on WLn+2 and the selected word line may be performed together. In step 1610, bit lines are again sensed.

In step 1612, Vrc is applied to the selected word line. In some embodiments, step 1612 is achieved by raising the voltage from Vrb to Vrb. Note that the voltage on the unselected word lines may remain at Vread. In step 1614, bit lines are again sensed. The state of the selected memory cells on the selected word line may then be determined in step 1616 by analyzing the results of the various sense operations.

Note that the processes of FIGS. 16A and 16B may be modified to implement the word line voltages depicted in FIGS. 12A-14B. One possible modification is to modify step 1602 to apply suitable voltages to the unselected word lines. Also, for step 1652 of FIG. 16B, all of the delta voltages may be reduced to Vread. Thus, detailed flowcharts for each example set of voltages will not be discussed.

One embodiment is a method of operating non-volatile storage that includes a plurality of strings of series connected non-volatile storage elements. The method comprises: applying a compare voltage to a selected word line, the selected word line is coupled to a selected non-volatile storage element on a first of the plurality of strings; applying a first pass voltage to a first unselected word line adjacent to the selected word line while applying the compare voltage to the selected word line, the first unselected word line is coupled to a first unselected non-volatile storage element on the first string; and applying a second pass voltage to a second unselected word line adjacent to the first unselected word line while applying the compare voltage to the selected word line and the first pass voltage to the first unselected word line, the second unselected word line is coupled to a second unselected non-volatile storage element on the first string, the second pass voltage is greater than the first pass voltage.

One embodiment is a non-volatile storage device comprising: a plurality of strings of series connected non-volatile storage elements; a plurality of word lines, each of the word lines coupled to one-volatile storage element of each of the plurality of strings; and one or more managing circuits in communication with the plurality of word lines. The one or more managing circuits apply a compare voltage to a selected word line of the plurality of word lines while applying a first pass voltage to a first unselected word line of the plurality of word lines and while applying a second pass voltage to a second unselected word line of the plurality of word lines. The first unselected word line is immediately between the selected word line and the second unselected word line, the second pass voltage is greater than the first pass voltage.

One embodiment is a method of operating non-volatile storage including a plurality of NAND strings. A NAND string has a first select gate at a first end of the NAND string, a second select gate at a second end of the NAND string, and a group of non-volatile storage elements between the first and second select gates. Each of the non-volatile storage elements has a control gate. The method comprises applying a compare voltage to the control gate of a selected non-volatile storage element on a first of the NAND strings; applying a first pass voltage to the control gate of a first unselected non-volatile storage element on the first NAND string; and applying a second pass voltage to the control gate of a second unselected non-volatile storage element on the first NAND string while applying the compare voltage to the selected non-volatile storage element and the first pass voltage to the first unselected non-volatile storage element. The second pass voltage is greater than the first pass voltage. The first unselected non-volatile storage element is immediately between the selected non-volatile storage element and the second unselected non-volatile storage element.

One embodiment is non-volatile storage device comprising a plurality NAND strings. A NAND string having a first select gate at a first end of the NAND string, a second select gate at a second end of the NAND string, and a group of non-volatile storage elements between the first and second select gates. Each of the non-volatile storage elements having a control gate. The device also has a plurality of word lines, each of the word lines coupled to one non-volatile storage element on each of the NAND strings. The device also has one or more managing circuits in communication with the plurality of word lines. The one or more managing circuits apply a compare voltage to the control gate of a selected non-volatile storage element on a first of the NAND strings. The one or more managing circuits apply a first pass voltage to the control gate of a first unselected non-volatile storage element on the first NAND string. The one or more managing circuits apply a second pass voltage to the control gate of a second unselected non-volatile storage element on the first NAND string while applying the compare voltage to the selected non-volatile storage element and the first pass voltage to the first unselected non-volatile storage element. The second pass voltage is greater than the first pass voltage. The first unselected non-volatile storage element is immediately between the selected non-volatile storage element and the second unselected non-volatile storage element.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of operating non-volatile storage, the non-volatile storage including a plurality of strings of series connected non-volatile storage elements, the method comprising:

applying a compare voltage to a selected word line, the selected word line is coupled to a selected non-volatile storage element on a first of the plurality of strings;

applying a first pass voltage to a first unselected word line adjacent to the selected word line while applying the compare voltage to the selected word line, the first unselected word line is coupled to a first unselected non-volatile storage element on the first string;

applying a second pass voltage to a second unselected word line adjacent to the first unselected word line while applying the compare voltage to the selected word line and the first pass voltage to the first unselected word line, the second unselected word line is coupled to a second unselected non-volatile storage element on the first string, the second pass voltage is greater than the first pass voltage and applying the first pass voltage to a third unselected word line adjacent to the second unselected word line while applying the compare voltage to the selected word line, while applying the first pass voltage to the first unselected word line, and while applying the second pass voltage to the second unselected word line, the third unselected word line is coupled to a third unselected non-volatile storage element on the string.

2. The method of claim 1, further comprising:

applying the first pass voltage to a fourth unselected word line adjacent to the selected word line while applying the compare voltage to the selected word line, the fourth unselected word line is coupled to a fourth unselected non-volatile storage element on the first string; and applying the second pass voltage to a fifth unselected word line adjacent to the fourth unselected word line while applying the compare voltage to the selected word line and while applying the first pass voltage to the fourth unselected word line, the fifth unselected word line is coupled to a fifth unselected non-volatile storage element on the first string.

3. The method of claim 1, wherein the applying a compare voltage to a selected word line is performed during a sense operation in which a plurality of compare voltages are applied to the selected word line, the plurality of compare voltages includes a first set of lower compare voltages and a second set of higher compare voltages, and further comprising:

applying the first pass voltage to the first unselected word line while applying each of the plurality of compare voltages to the selected word line during the sense operation; and applying the second pass voltage to the second unselected word line while applying each of the plurality of compare voltages to the selected word line and the first pass voltage to the first unselected word line during the sense operation.

4. A non-volatile storage device comprising:

a plurality of strings of series connected non-volatile storage elements;

a plurality of word lines, each of the word lines coupled to one-volatile storage element of each of the plurality of strings; and one or more managing circuits in communication with the plurality of word lines, the one or more managing circuits apply a compare voltage to a selected word line of the plurality of word lines while applying a first pass voltage to a first unselected word line of the plurality of word lines and while applying a second pass voltage to a second unselected word line of the plurality of word lines, the first unselected word line is immediately between the selected word line and the second unselected word line, the second pass voltage is greater than the first pass voltage, the one or more managing circuits apply the first pass voltage to a third unselected word line adjacent to the second unselected word line while applying the compare voltage to the selected word line, while applying the first pass voltage to the first unselected word line, and while applying the second pass voltage to the second unselected word line, the third unselected word line is coupled to a third unselected non-volatile storage element on the first string.

5. The non-volatile storage device of claim 4, wherein the one or more managing circuits apply the first pass voltage to a fourth unselected word line adjacent to the selected word line while applying the compare voltage to the selected word line, the one or more managing circuits apply the second pass voltage to a fifth unselected word line adjacent to the fourth unselected word line while applying the compare voltage to the selected word line and the first pass voltage to the fourth unselected word line.

6. The non-volatile storage device of claim 4, wherein the one or more managing circuits apply a compare voltage to a selected word line during a sense operation in which a plurality of compare voltages are applied to the selected word line, the plurality of compare voltages includes a first set of lower compare voltages and a second set of higher compare voltages, the one or more managing circuits apply the first pass voltage to the first unselected word line while applying each of the plurality of compare voltages to the selected word line, the one or more managing circuits apply the second pass voltage to the second unselected word line while applying each of the compare voltages to the selected word line and the first pass voltage to the first unselected word line during the sense operation.

7. A method of operating non-volatile storage, the non-volatile storage including a plurality of strings of series connected non-volatile storage elements, the method comprising:

performing a sense operation that includes applying a plurality of compare voltages to a selected word line, the plurality of compare voltages include a first set of lower compare voltages and a second set of higher compare voltages, the selected word line is coupled to a selected non-volatile storage element on a first of the plurality of strings;

applying a first pass voltage to a first unselected word line adjacent to the selected word line while applying each of the plurality of compare voltages to the selected word line during the sense operation, the first unselected word line is coupled to a first unselected non-volatile storage element on the first string;

applying a second pass voltage to a second unselected word line adjacent to the first unselected word line while applying the compare voltages in the first set to the selected word line and the first pass voltage to the first unselected word line during the sense operation, the second unselected word line is coupled to a second unselected non-volatile storage element on the first string, the second pass voltage is greater than the first pass voltage; and applying the first pass voltage to the second unselected word line while applying the compare voltages in the second set to the selected word line and the first pass voltage to the first unselected word line during the sense operation.

8. The method of claim 7, wherein the plurality of strings of series connected non-volatile storage elements are a plurality of NAND strings.

9. A non-volatile storage device comprising:

a plurality of strings of series connected non-volatile storage elements;

a plurality of word lines, each of the word lines coupled to one-volatile storage element of each of the plurality of strings; and one or more managing circuits in communication with the plurality of word lines, the one or more managing circuits perform a sense operation that includes applying a plurality of compare voltages to a selected word line, the plurality of compare voltages include a first set of lower compare voltages and a second set of higher compare voltages, the selected word line is coupled to a selected non-volatile storage element on a first of the plurality of strings, the one or more managing circuits apply a first pass voltage to a first unselected word line adjacent to the selected word line while applying each of the plurality of compare voltages to the selected word line during the sense operation, the first unselected word line is coupled to a first unselected non- volatile storage element on the first string, the one or more managing circuits apply a second pass voltage to a second unselected word line adjacent to the first unselected word line while applying the compare voltages in the first set to the selected word line and the first pass voltage to the first unselected word line during the sense operation, the second unselected word line is coupled to a second unselected non-volatile storage element on the first string, the second pass voltage is greater than the first pass voltage, the one or more managing circuits apply the first pass voltage to the second unselected word line while applying the compare voltages in the second set to the selected word line and the first pass voltage to the first unselected word line during the sense operation.

10. The non-volatile storage device of claim 9, wherein the plurality of strings of series connected non-volatile storage elements are a plurality of NAND strings.

11. A method of operating non-volatile storage, the non-volatile storage including a plurality of strings of series connected non-volatile storage elements, the method comprising:
applying a compare voltage to a selected word line, the selected word line is coupled to a selected non-volatile storage element on a first of the plurality of strings;
applying a first pass voltage to a first unselected word line adjacent to the selected word line while applying the compare voltage to the selected word line, the first unselected word line is coupled to a first unselected non-volatile storage element on the first string;
applying a second pass voltage to a second unselected word line adjacent to the first unselected word line while applying the compare voltage to the selected word line and the first pass voltage to the first unselected word line, the second unselected word line is coupled to a second unselected non-volatile storage element on the first string, the second pass voltage is greater than the first pass voltage; and
applying a third pass voltage to a third unselected word line adjacent to the second unselected word line while applying the compare voltage to the selected word line, while applying the first pass voltage to the first unselected word line, and while applying the second pass voltage to the second unselected word line, the third unselected word line is coupled to a third unselected non-volatile storage element on the first string, the third pass voltage is less than the first pass voltage.

12. The method of claim 11, further comprising applying the third pass voltage to a fourth unselected word line adjacent to the third unselected word line while applying the compare voltage to the selected word line, while applying the first pass voltage to the first unselected word line, while applying the second pass voltage to the second unselected word line, and while applying the third pass voltage to the third unselected word line, the fourth unselected word line is coupled to a fourth unselected non-volatile storage element on the first string.

13. The method of claim 11, wherein the first pass voltage that is applied to the first unselected word line is increased relative to a normal read pass voltage that is applied to unselected word lines.

14. The method of claim 11, further comprising:
applying a fourth pass voltage to a fourth unselected word line adjacent to the third unselected word line while applying the third pass voltage to the third unselected word line, while applying the compare voltage to the selected word line, while applying the first pass voltage to the first unselected word line, and while applying the second pass voltage to the second unselected word line, the fourth unselected word line is coupled to a fourth unselected non-volatile storage element on the first string, the fourth pass voltage is greater than the third pass voltage and less than the first pass voltage.

15. The method of claim 11, wherein the second and third unselected word lines reside between the selected word line and either a source side select line or a drain side select line, and further comprising:
applying the second pass voltage to every alternate word line between the second unselected word line and the source side or drain side select line while applying the compare voltage to the selected word line, while applying the first pass voltage to the first unselected word line, and while applying the second pass voltage to the second unselected word line; and
applying the third pass voltage to every alternate word line between the third unselected word line and the source side or drain side select line while applying the compare voltage to the selected word line, while applying the first pass voltage to the first unselected word line, and while applying the second pass voltage to the second unselected word line and every alternate word line between the second unselected word line and the source side or drain side select line, the third pass voltage is less than the first pass voltage.

16. A non-volatile storage device comprising:
a plurality of strings of series connected non-volatile storage elements;
a plurality of word lines, each of the word lines coupled to one-volatile storage element of each of the plurality of strings; and
one or more managing circuits in communication with the plurality of word lines, the one or more managing circuits apply a compare voltage to a selected word line, the selected word line is coupled to a selected non-volatile storage element on a first of the plurality of strings, the one or more managing circuits apply a first pass voltage to a first unselected word line adjacent to the selected word line while applying the compare voltage to the selected word line, the first unselected word line is coupled to a first unselected non-volatile storage element on the first string, the one or more managing circuits apply a second pass voltage to a second unselected word line adjacent to the first unselected word line while applying the compare voltage to the selected word line and the first pass voltage to the first unselected word line, the second unselected word line is coupled to a second unselected non-volatile storage element on the first string, the second pass voltage is greater than the first pass voltage, the one or more managing circuits apply a third pass voltage to a third unselected word line adjacent to the second unselected word line while applying the compare voltage to the selected word line, while applying the first pass voltage to the first unselected word line, and while applying the second pass voltage to the second unselected word line, the third unselected word line is coupled to a third unselected non-volatile storage element on the first string, the third pass voltage is less than the first pass voltage.

17. The non-volatile storage device of claim 16, wherein the one or more managing circuits apply the third pass voltage to a fourth unselected word line adjacent to the third unselected word line while applying the compare voltage to the selected word line, while applying the first pass voltage to the first unselected word line, while applying the second pass voltage to the second unselected word line, and while applying the third pass voltage to the third unselected word line, the fourth unselected word line is coupled to a fourth unselected non-volatile storage element on the first string.

18. The non-volatile storage device of claim 16, wherein the first pass voltage that the one or more managing circuits apply to the first unselected word line is increased relative to a normal read pass voltage that the one or more managing circuits apply to unselected word lines.

19. The non-volatile storage device of claim 16, wherein the plurality of strings of series connected non-volatile storage elements are a plurality of NAND strings.

20. The non-volatile storage device of claim 16, wherein the one or more managing circuits apply a fourth pass voltage to a fourth unselected word line adjacent to the third unselected word line while applying the third pass voltage to the third unselected word line, while applying the compare voltage to the selected word line, while applying the first pass voltage to the first unselected word line, and while applying the second pass voltage to the second unselected word line, the fourth unselected word line is coupled to a fourth unselected non-volatile storage element on the first string, the fourth pass voltage is greater than the third pass voltage and less than the first pass voltage.

21. The non-volatile storage device of claim 16, wherein the second and third unselected word lines reside between the selected word line and either a source side select line or a drain side select line, wherein the one or more managing circuits apply the second pass voltage to every alternate word line between the second unselected word line and the source side or drain side select line while applying the compare voltage to the selected word line, while applying the first pass voltage to the first unselected word line, and while applying the second pass voltage to the second unselected word line, the one or more managing circuits apply the third pass voltage to every alternate word line between the third unselected word line and the source side or drain side select line while applying the compare voltage to the selected word line, while applying the first pass voltage to the first unselected word line, and while applying the second pass voltage to the second unselected word line and every alternate word line between the second unselected word line and the source side or drain side select line, the third pass voltage is less than the first pass voltage.

22. The method of claim 2, further comprising applying the first pass voltage to all other unselected word lines other than the second unselected word line and the fifth unselected word line.

23. The method of claim 2, wherein the first pass voltage that is applied to the first unselected word line is increased relative to a normal read pass voltage applied to unselected word lines.

* * * * *